United States Patent [19]
Sakugawa et al.

[11] Patent Number: 5,621,694
[45] Date of Patent: Apr. 15, 1997

[54] SEMICONDUCTOR INTEGRATED DEVICE WITH AN IMPROVED PERFORMANCE

[75] Inventors: Mamoru Sakugawa; Takeshi Hashizume; Kazuhiro Sakashita, all of Hyogo, Japan

[73] Assignee: Mitsubishi Denki Kabushiki Kaisha, Tokyo, Japan

[21] Appl. No.: 550,809

[22] Filed: Oct. 31, 1995

[30] Foreign Application Priority Data

Dec. 28, 1994 [JP] Japan .................................. 6-327596

[51] Int. Cl.⁶ .............................. G11C 7/00; G11C 8/00; G06G 9/30
[52] U.S. Cl. ............... 365/230.02; 365/239; 365/189.02; 395/800
[58] Field of Search ................................ 365/73, 189.02, 365/230.02, 239, 240; 395/375

[56] References Cited

U.S. PATENT DOCUMENTS 5,226,126  7/1993  McFarland et al. .................... 395/375

FOREIGN PATENT DOCUMENTS

| 63-62064 | 3/1988 | Japan . |
| 397340 | 4/1991 | Japan . |
| 546535 | 2/1993 | Japan . |
| 5120211 | 5/1993 | Japan . |
| 5128054 | 5/1993 | Japan . |

OTHER PUBLICATIONS

Computer Design, pp. 25–37, May 1993, Yoshinori Kawamura, et al., "All About Pentium Processor".

Primary Examiner—David C. Nelms
Assistant Examiner—Trong Phan
Attorney, Agent, or Firm—Oblon, Spivak, McClelland, Maier & Neustadt P.C.

[57] ABSTRACT

A semiconductor integrated circuit, which can process n-bit (n is an integer, n>1) instructions or data at a time, has queues for storing instructions or data of m (m>1) times n bits received from an external memory through an instruction bus or a data bus. Therefore, it is possible to achieve an improvement in performance of the semiconductor integrated circuit and further to provide a low-priced semiconductor integrated circuit.

25 Claims, 30 Drawing Sheets

SEMICONDUCTOR INTEGRATED DEVICE WITH AN IMPROVED PERFORMANCE

BACKGROUND OF THE INVENTION

1. Field of the Invention

The present invention relates to a semiconductor integrated circuit, and more particularly to techniques for improving performance of the semiconductor integrated circuit.

2. Description of the Background Art

With rapid advancement of techniques for manufacturing a semiconductor device, great improvement in performance of a microprocessor has been achieved. On the other hand, memory integration has been improved, but access performance has not been so much enhanced. For this reason, the difference in performance between a microprocessor and a memory is becoming wider and therefore it becomes hard to achieve so much improvement in performance of a system on the whole even if it carries a high-performance microprocessor. For the microprocessor always performs a transfer of data with the memory and a time-consuming memory access hinders an efficient internal processing of the microprocessor. Then, there arises a need to suppress degradation in performance due to memory access and enhance the performance of the system on the whole.

FIG. 29 shows a prior art semiconductor integrated circuit, which is configured so as to eliminate the difference in performance between a microprocessor and a memory. In FIG. 29, reference numerals 1, 2 and 3 designate a memory, a microprocessor and a bus controller, respectively. The bus controller 3 internally has a control unit 4 and a register 5. This figure shows an exemplary configuration to achieve an improvement in efficiency of data transfer when an internal bus of the microprocessor 2 and an external bus (e.g., address bus, data bus) have different bus widths. For example, it is now assumed that a wider bus has a 16-bit width and a narrower bus has an 8-bit width. When a data transfer is performed from the narrower bus to the wider bus, 8-bit data from the narrower bus are first stored in the register 5 and another 8-bit data from the narrower bus are received to make 16-bit data, and then the 16-bit data are transmitted to the wider bus. When a data transfer is performed from the wider bus to the narrower bus, 16-bit data from the wider bus are divided into two 8-bit data and stored into the register 5, and then each 8-bit data are transmitted to the narrower bus.

Thus, in the prior art semiconductor integrated circuit, since the bus controller operates independently from the microprocessor, it is impossible to exercise a register control taking the internal processing of the microprocessor into account. That causes degradation in performance of the semiconductor integrated circuit. For example, it is impossible to clear the data stored in the register or perform such an internal processing as not to fill the register with data during a load delay when, for example, a branch instruction is executed or a branch is taken. Furthermore, it is difficult for the microprocessor to internally perform a dynamic scheduling by capturing in advance a plurality of instructions therein. The dynamic scheduling means herein changing of the executing order of instructions stored in a queue, by which improvement in performance may be expected with no trouble.

Moreover, in the prior art semiconductor integrated circuit, providing a control function over data division and the like outside the microprocessor causes an increase in the number of components of the semiconductor integrated circuit and an increase in manufacturing cost.

SUMMARY OF THE INVENTION

The present invention is directed to a semiconductor integrated circuit. According to the first aspect of the present invention, the semiconductor integrated circuit comprises: a core for processing first data in units of n bits (n is an integer more than 1); at least one queue of (n×m)-bit width (m>1), for receiving second data having a bit width of (n×m) bits or less from an external memory and storing the second data therein; and a multiplexer for receiving the second data from the at least one queue and selectively outputting n bits out of the second data to the core as the first data.

Preferably, the at least one queue includes p queues (p is an integer more than 1) serially connected to one another, the p queues constitute a group of queues, and the semiconductor integrated circuit further comprises a queue control portion for transmitting the second data to the multiplexer by sequentially shifting the second data from one of the p queues to the next one.

Preferably, the semiconductor integrated circuit further comprises a bus of (n×m)-bit width, for transmitting the second data from the external memory to the group of queues.

Preferably, the semiconductor integrated circuit further comprising an aligner interposed at some midpoint in the bus.

Preferably, the second data are variable-length data, and the semiconductor integrated circuit further comprises a selector for outputting the second data to a prescribed memory location of the nearest one of the queues to the bus.

Still preferably, the semiconductor integrated circuit further comprises a cache memory interposed at some midpoint in the bus.

According to the second aspect of the present invention, the semiconductor integrated circuit comprises: (a) a core for processing a first instruction or first data in units of n bits (n is an integer more than 1); (b) a group of instruction queues including (b-1) a first instruction queue of (n×m)-bit width (m>1), for receiving second instruction having a bit width of (n×m) bits or less from an external memory and storing the second instruction therein; and (b-2) an s-th instruction queue ($1 < s \leq p$: p is an integer more than 1) of (n×m)-bit width, for receiving the second instruction from an (s−1)-th instruction queue and storing the second instruction therein, which has serial connection of the first to p-th instruction queues, (c) a group of data queues including (c-1) a first data queue of (n×m)-bit width (m>1), for receiving second data having a bit width of (n×m) bits or less from the external memory and storing the second data therein; and (c-2) a t-th data queue ($1 < t \leq q$: q is an integer more than 1) of (n×m)-bit width, for receiving the second data from a (t−1)-th data queue and storing the second data therein, which has serial connection of the first to q-th data queues, (d) a queue control portion for sequentially shifting the second instruction and the second data in the group of instruction queues and the group of data queues, respectively; (e) a first multiplexer for receiving the second instruction from the p-th instruction queue and selectively outputting n bits out of the second instruction to the core as the first instruction: and (f) a second multiplexer for receiving the second data from the q-th data queue and selectively outputting n bits out of the second data to the core as the first data.

Preferably, the second instruction and the second data are variable-length data, and the semiconductor integrated circuit further comprises (g) a first selector disposed between the group of instruction queues and the external memory, for outputting the second instruction to a prescribed memory location of the first instruction queue; and (h) a second selector disposed between the group of data queues and the external memory, for outputting the second data to a prescribed memory location of the first data queue.

Preferably, the semiconductor integrated circuit further comprises: (g) an instruction bus connecting the external memory to the first instruction queue, for transmitting the second instruction; and (h) a data bus connecting the external memory to the first data queue, for transmitting the second data.

Preferably, the semiconductor integrated circuit further comprises an aligner interposed at some midpoint in at least one of the instruction bus and the data bus.

Still preferably, the external memory is separated into an instruction memory and a data memory, and the instruction bus and the data bus are connected to the instruction memory and the data memory, respectively.

According to the third aspect of the present invention, the semiconductor integrated circuit comprises: (a) a core for processing a first instruction or first data in units of n bits (n is an integer more than 1); (b) a group of instruction queues including (b-1) a first instruction queue of n-bit width, for receiving n bits out of second instruction from an external memory and storing the n bits out of the second instruction therein; and (b-2) an s-th instruction queue ($1<s\leq p$: p is an integer more than 1) of n-bit width, for receiving the n bits out of the second instruction from an (s−1)-th instruction queue and storing the n bits out of the second instruction therein, which has serial connection of the first to p-th instruction queues, (c) a group of data queues including (c-1) a first data queue of n-bit width, for receiving n bits out of second data from the external memory and storing the n bits out of the second data therein; and (c-2) a t-th data queue ($1<t\leq q$: q is an integer more than 1) of n-bit width for receiving the n bits out of the second data from a (t−1)-th data queue and storing the n bits out of the second data therein, which has serial connection of the first to q-th data queues, (d) a group of common queues of {n×(m−1)}-bit width, for receiving both the second instruction and the second data and storing them therein; (e) a queue control portion for sequentially shifting the second instruction and the second data in the group of instruction queues and the group of data queues, respectively, and in the group of common queues; (f) a first bus of n-bit width connecting the external memory to the first instruction queue and the first data queue, for transmitting the second instruction and the second data: (g) a second bus of {n×(m−1)}-bit width connecting the external memory to the group of common queues, for transmitting the second instruction and the second data; (h) a first multiplexer for receiving the second instruction froth both the group of instruction queues and the group of common queues, and selectively outputting the n bits out of the second instruction to the core as the first instruction; and (i) a second multiplexer for receiving the second data from both the group of data queues and the group of common queues, and selectively outputting the n bits out of the second data to the core as the first data.

Preferably, the semiconductor integrated circuit further comprises (j) a cache memory interposed at some midpoint in the second bus.

According to the fourth aspect of the present invention, the semiconductor integrated circuit comprises: (a) a core for processing a first instruction or first data in units of n bits (n is an integer more than 1); (b) a group of instruction queues including (b-1) a first instruction queue of (n×m)-bit width (m>1), for receiving second instruction having a bit width of (n×m) bits or less from an external memory and storing the second instruction therein; and (b-2) an s-th instruction queue ($1<s\leq p$: p is an integer more than 1) or (n×m)-bit width, for receiving the second instruction from an (s−1)-th instruction queue and storing the second instruction therein, which has serial connection of the first to p-th instruction queues, (c) a group of data queues including (c-1) a first data queue of n-bit width, for receiving second data of n-bit width from the external memory and storing the second data therein; and (c-2) a t-th data queue ($1<t\leq q$: q is an integer more than 1) of n-bit width, for receiving the second data from a (t−1)-th data queue and storing the second data therein, which has serial connection of the first to q-th data queues, (d) a queue control portion for sequentially shifting the second instruction and the second data in the group of instruction queues and the group of data queues, respectively; and (e) a multiplexer for receiving the second instruction from the p-th instruction queue and selectively outputting n bits out of the second instruction to the core as the first instruction, and the first data is obtained from the q-th data queue.

Preferably, the semiconductor integrated circuit further comprises: (f) an instruction bus connecting the external memory to the first instruction queue, for transmitting the second instruction; and (g) a data bus connecting the external memory to the first data queue, for transmitting the second data.

Preferably, the semiconductor integrated circuit further comprises an aligner interposed at some midpoint in at least one of the instruction bus and the data bus.

Still preferably, the external memory is separated into an instruction memory and a data memory, and the instruction bus anti the data bus are connected to the instruction memory and the data memory, respectively.

According to the fifth aspect of the present invention, the semiconductor integrated circuit, comprises: (a) a core for processing a first instruction or first data in units of n bits (n is an integer more than 1); (b) a group of instruction queues including (b-1) a first instruction queue of n-bit width, for receiving second instruction of n-bit width from an external memory and storing the second instruction therein; and (b-2) an s-th instruction queue ($1<s\leq p$: p is an integer more than 1) of n-bit width, for receiving the second instruction from an (s−1)-th instruction queue and storing the second instruction therein, which has serial connection of the first to p-th instruction queues, (c) a group of data queues including (c-1) a first data queue of (n×m)-bit width (m>1), for receiving second data having a bit width of (n×m) bits or less from the external memory and storing the second data therein; and (c-2) a t-th data queue ($1<t\leq q$: q is an integer more than 1) of (n×m )-bit width, for receiving the second data from a (t−1)-th data queue and storing the second data therein, which has serial connection of the first to q-th data queues, (d) a queue control portion for sequentially shifting the second instruction and the second data in the group of instruction queues and the group of data queues, respectively; and (e) a multiplexer for receiving the second data from the q-th data queue and selectively outputting n bits out of the second data to the core as the first data, and the first instruction is obtained from the p-th instruction queue.

Preferably, the semiconductor integrated circuit further comprises: (f) an instruction bus connecting the external memory to the first instruction queue, for transmitting the second instruction; and (g) a data bus connecting the external memory to the first data queue, for transmitting the second data.

Preferably, the semiconductor integrated circuit further comprises an aligner interposed at some midpoint in at least one of the instruction bus and the data bus.

Still preferably, the external memory is separated into an instruction memory and a data memory, and the instruction bus and the data bus are connected to the instruction memory and the data memory, respectively.

According to the sixth aspect of the present invention, the semiconductor integrated circuit, comprises: (a) a core for processing a first instruction or first data in units of n bits (n is an integer more than 1); (b) a group of instruction queues including (b-1) a first instruction queue of (n×m)-bit width (m>1), for receiving second instruction having a bit width of (n×m) bits or less from an external memory and storing the second instruction therein; and (b-2) an s-th instruction queue (1<s≦p: p is an integer more than 1) of (n×m)-bit width, for receiving the second instruction from an (s−1)-th instruction queue and storing the second instruction therein, which has serial connection of the first to p-th instruction queues, (c) a group of data queues including (c-1) a first data queue of (n×k)-bit width (k>m), for receiving second data having a bit width of (n×k) bits or less from the external memory and storing the second data therein; and (c-2) a t-th data queue (1<t≦q: q is an integer more than 1) of (n×k)-bit width, for receiving the second data from a (t−1)-th data queue and storing the second data therein, which has serial connection of the first to q-th data queues, (d) a queue control portion for sequentially shifting the second instruction and the second data in the group of instruction queues and the group of data queues, respectively; (e) a first multiplexer for receiving the second instruction from the p-th instruction queue and selectively outputting n bits out of the second instruction to the core as the first instruction; and (f) a second multiplexer for receiving the second data from the q-th data queue and selectively outputting n bits out of the second data to the core as the first data.

Preferably, the semiconductor integrated circuit further comprises: (g) an instruction bus connecting the external memory to the first instruction queue, for transmitting the second instruction; and (h) a data bus connecting the external memory to the first data queue, for transmitting the second data.

Preferably, the semiconductor integrated circuit further comprises an aligner interposed at some midpoint in at least one of the instruction bus and the data bus.

Still preferably, the external memory is separated into an instruction memory and a data memory, and the instruction bus and the data bus arc connected to the instruction memory and the data memory, respectively.

The semiconductor integrated circuit in accordance with the present invention internally has a group of queues to store instructions or data of m times n bits when the semiconductor integrated circuit internally processes n bits at a time, and accordingly is capable of performing an internal operation in response to the processing conditions within the semiconductor integrated circuit.

Therefore, the semiconductor integrated circuit in accordance with the present invention achieves an efficient internal processing when, for example, a branch instruction is executed and can perform a dynamic scheduling, thus ensuring an improvement in its performance.

Moreover, provision of the group of queues within the semiconductor integrated circuit allows reduction in the number of components. That further causes reduction in manufacturing cost. Thus, it becomes possible to provide a low-priced semiconductor integrated circuit.

An object of the present invention is to achieve an improvement in performance of a semiconductor integrated circuit and to provide a low-priced semiconductor integrated circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
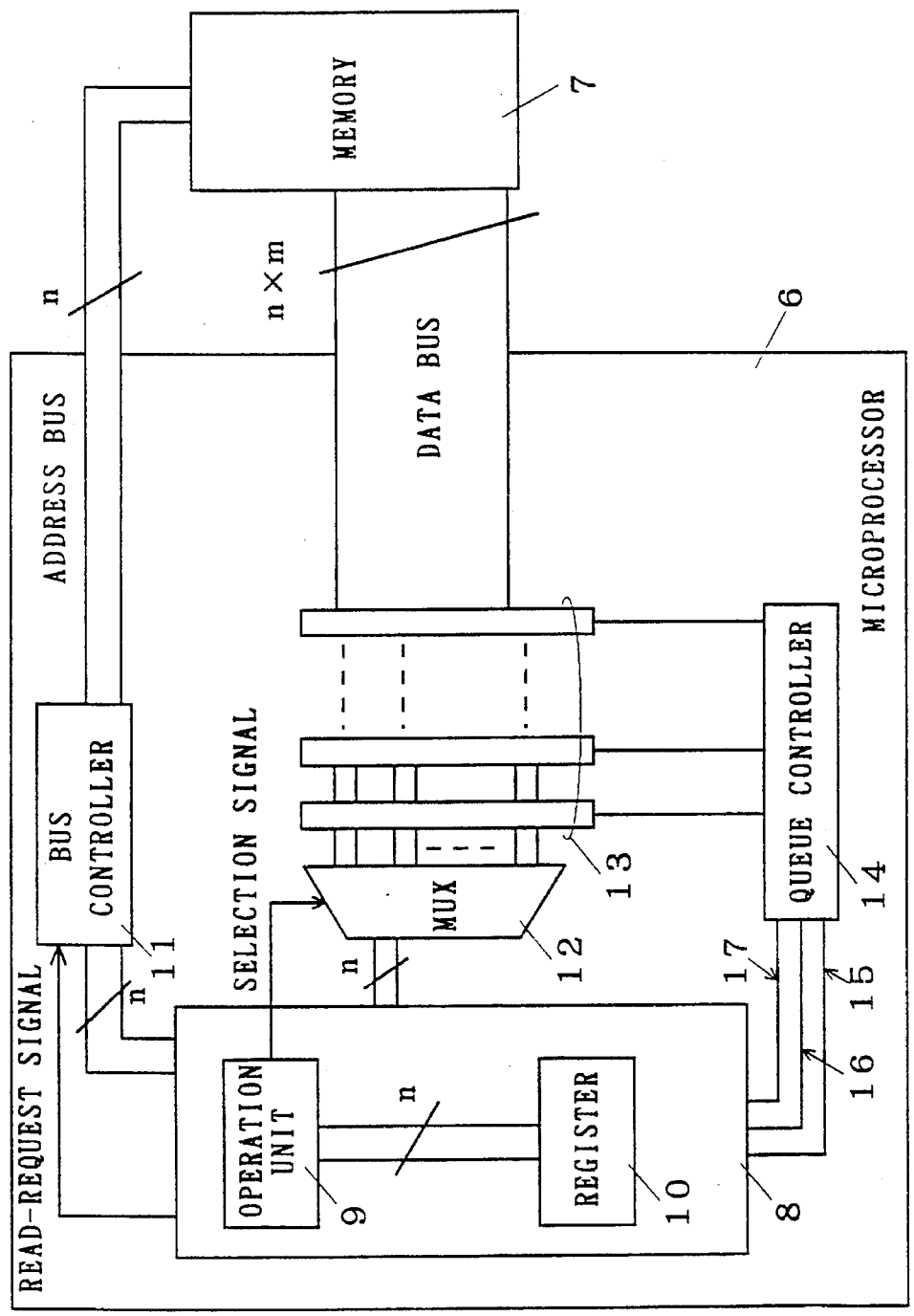
FIG. 1 is a circuit diagram showing a configuration of a semiconductor integrated circuit in accordance with a first preferred embodiment of the present invention.

FIG. 1 shows a configuration of a semiconductor integrated circuit in accordance with the first preferred embodiment of the present invention. A microprocessor 6 and a memory 7 are connected to each other through an address bus of n-bit width and a data bus of (n×m)-bit width. The microprocessor 6 comprises a core 8. The core 8 includes an operation unit 9 and a register 10 and performs an n-bit operation. In the first preferred embodiment, it is assumed that the microprocessor 6 processes instructions or data in units of n bits. The core 8 further includes a CPU (Central Processing Unit) not shown. For example, the CPU controls a bus controller 11 to give addresses to the memory 7 through the address bus. A multiplexer 12 (referred to as "MUX" hereinafter) selects data from a queue as discussed later to output the selected data to the operation unit 9. A group of queues 13 consists of queues each having (n×m)-bit width (m>1), and each queue $13_i$ stores instructions or data of m times n bits when the microprocessor 6 can process n-bit instruction or data at a time. A queue controller 14 controls the group of queues 13.

Figure 2:
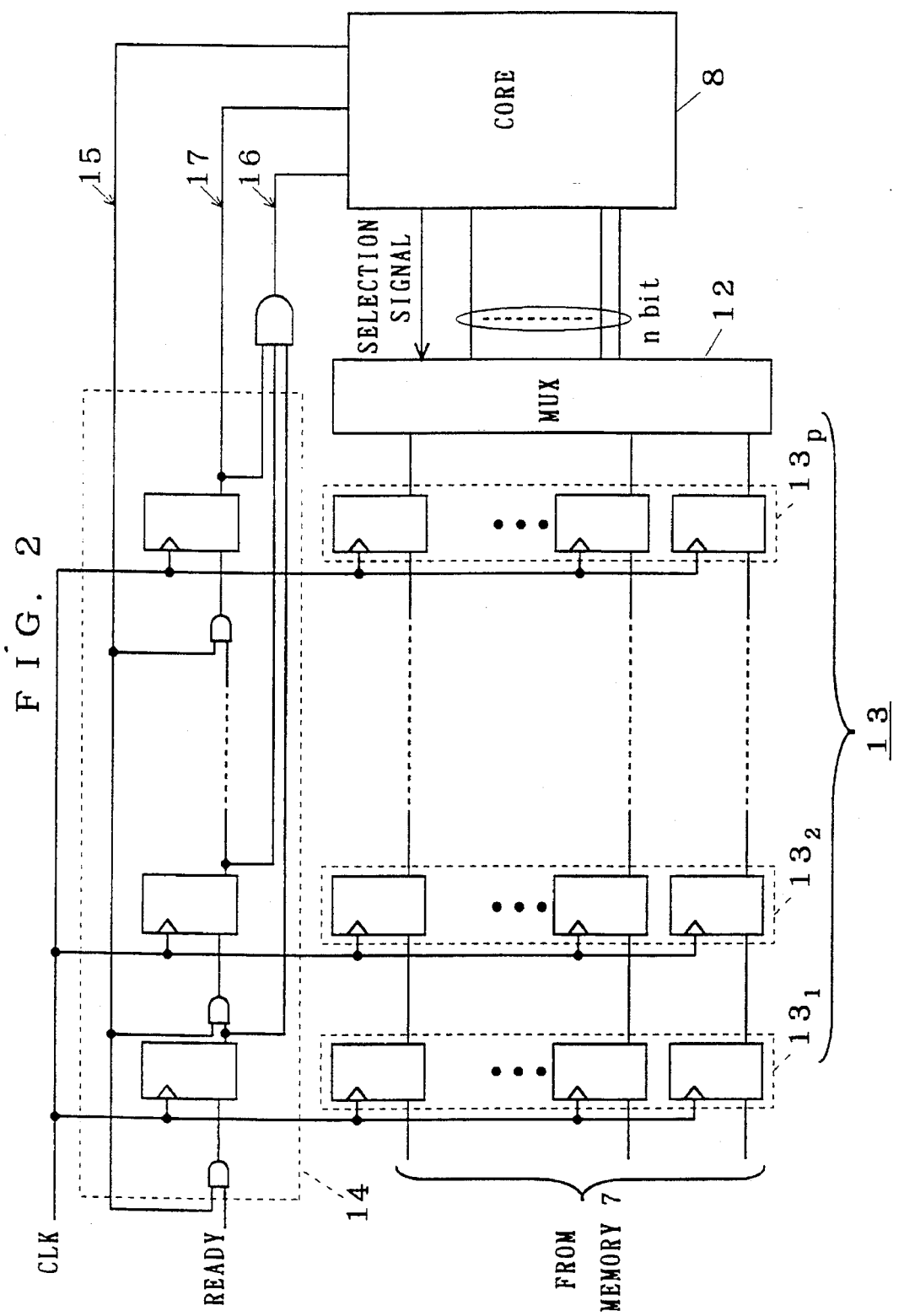
FIG. 2 is a detailed view of the circuit diagram of FIG. 1.

FIG. 2 partially shows the circuit diagram of FIG. 1 in more detail. Each queue $13_i$ consists of (n×m) D flip flops aligned in a line, and receives (n×m)-bit instruction or data in synchronization with a clock signal CLK. The received instruction or data are sequentially shifted from a queue $13_1$ to a queue $13_p$. The queue controller 14 controls an operation (such as a shift operation from a lower stage to an upper stage of the group of queues) on the instructions or data inputted into the group of queues 13 by applying a signal to a clock end of each D flip flop in accordance with the clock signal CLK and clears all of the queues $13_1$ to $13_p$ in accordance with a queue clear signal 15 given by the CPU.

The queue controller 14 outputs a queue state signal 16 indicating an internal state of the queue $13_i$ to the CPU. The queue state signal 16 of "0" indicates that there is free area in the queues $13_1$ to $13_p$, and the CPU, receiving the queue state signal 16 of "0", gives a read-request to the memory 7. The queue state signal 16 of "1" indicates that the queue $13_1$ to $13_p$, are full, and the CPU, receiving the queue state signal 16 of "1", reads no instruction from the memory 7.

The queue controller 14 consists of the first to p-th D flip flops serially connected, corresponding to the first to p-th queues $13_1$ to $13_p$, respectively. The first to p-th D flip flops shift a ready signal indicating that data have been outputted from the memory 7 at the same timing as the queues $13_1$ to $13_p$ shift data, to output an effectiveness signal 17 indicating the effectiveness of the data stored in the queues $13_p$. The effectiveness signal 17 becomes "1" only when the data in the queue $13_p$ have effective information.

When the effectiveness signal 17 is "1", the data in the queue $13_1$ are divided into data blocks of an appropriate size by the MUX 12 in accordance with a selection signal, and in other words, a D flip flops storing the data (instruction) to be adopted is selected at this time. Then, the divided data are outputted to the CPU.

Figure 3:
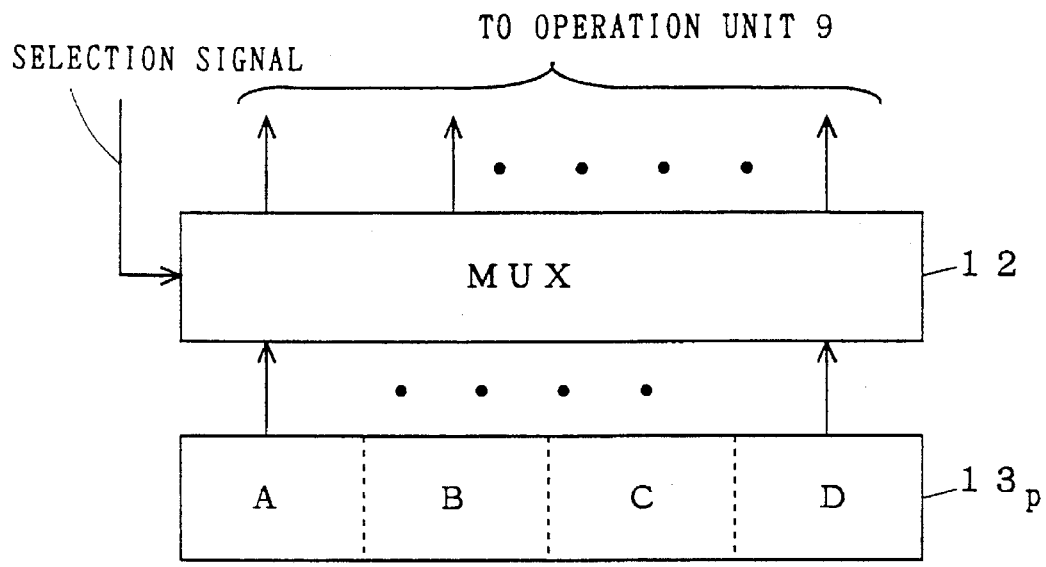
FIG. 3 is a view illustrating an operation of a multiplexer (MUX) 12 for selecting a group of queues 13.

FIG. 3 illustrates an operation of the MUX 12 for selecting a content of the queue $13_p$. For convenience of discussion, it is herein assumed that the queue $13_i$ stores instructions. For example, four 8-bit instructions A to D are stored in the queue $13_p$. The instruction A should be normally selected in accordance with the selection signal from the CPU. In a case, however, where the operation unit 9 requires the instruction C because of jump instruction executed in the operation unit 9, the MUX 12 selects the instruction C and outputs the instruction C to the operation unit 9 in the core 8.

In the first preferred embodiment, the data bus for making access to the memory 7 has a width of m (m>1) times n bits so as to read instructions of m times n bits (n×m bits), while the microprocessor 6 can process instructions of n-bit width. The (n×m)-bit instructions from the memory 7 are stored in the group of queues 13 provided within the microprocessor 6. The instructions are read out from the memory 7 in accordance with the request given by the microprocessor 6 every one cycle of the clock signal CLK or every several cycles, and thus an efficient internal processing can be performed. From the memory 7, m n-bit instructions are outputted every one address signal. The instructions stored in the group of queues 13 are shifted from the queue $13_1$ to the queue $13_p$ and divided by the MUX 12 into instructions each having such a size as the microprocessor 6 can process, and then the divided instructions are outputted to the operation unit 9 in the core 8. A bus width that the microprocessor 6 can process at a time is used as a unit in division of the instructions performed by the MUX 12. The bus width of n bits that the microprocessor 6 can process is, for example, 8 bits when the microprocessor 6 has an 8-bit ALU, or 16 bits when the microprocessor 6 has two 8-bit ALU. The instructions to be stored in each queue $13_i$ are outputted from the memory 7 in a bus width of m times 8 bits or m times 16 bits (e.g., m is 2 or more).

Figure 4:
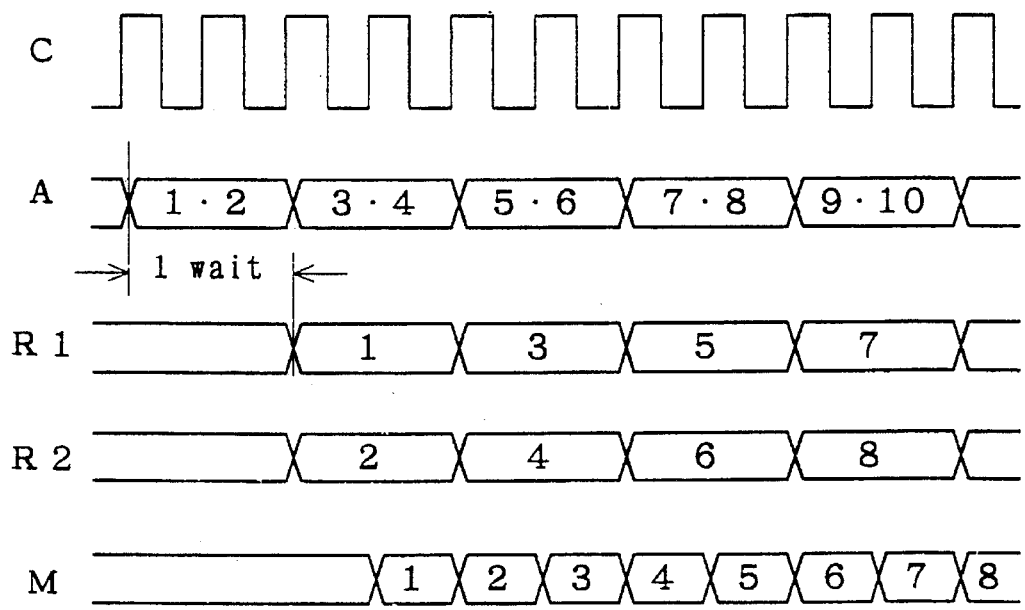
FIG. 4 is a timing chart showing an operation of 1-wait memory access with respect to the operation speed of a microprocessor 6.
Figure 5:
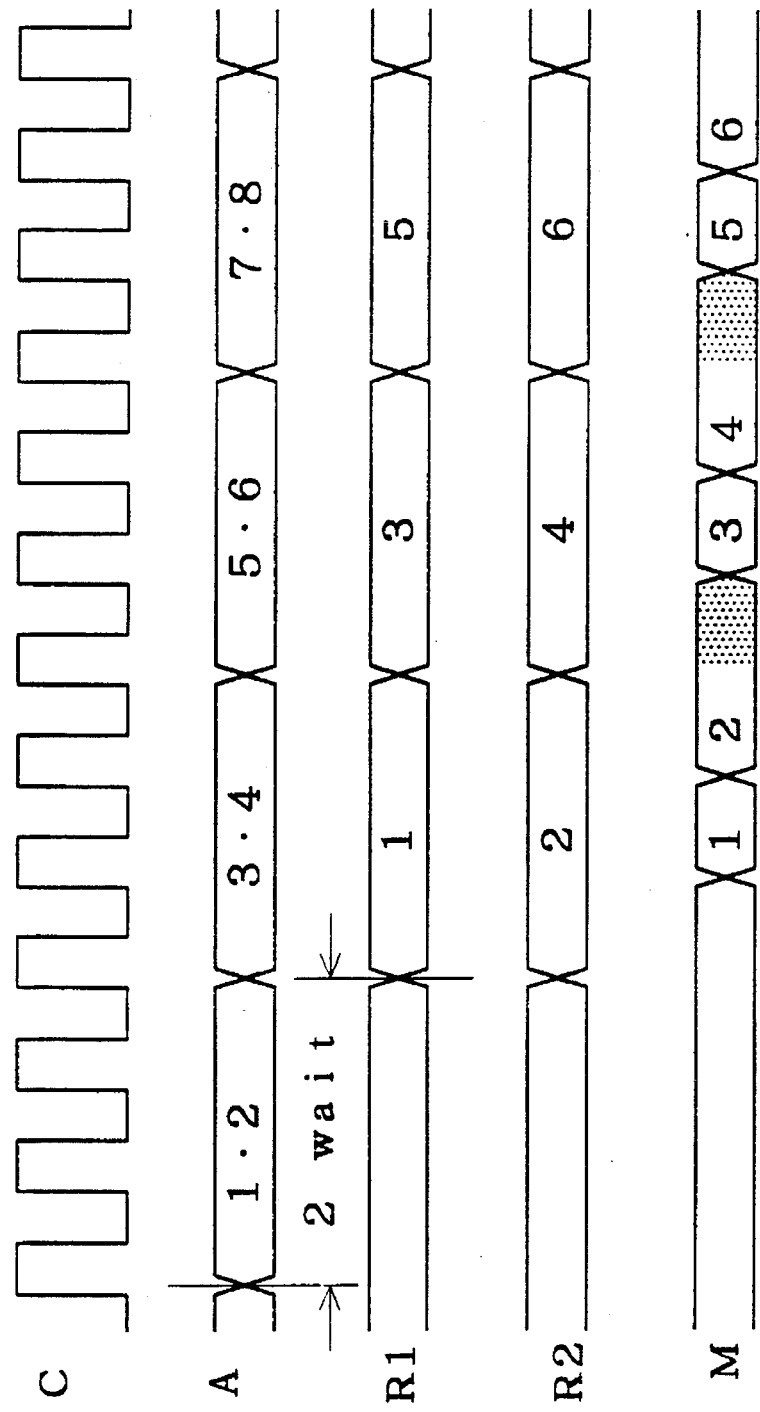
FIG. 5 is a timing chart showing an operation of 2-wait memory access with respect to the operation speed of the microprocessor 6.

FIGS. 4 and 5 are timing charts showing operations where data are outputted from the memory 1 to the microprocessor 2 in the background-art device. These figures each show a reference clock C for the operation of the microprocessor 2, an address signal A outputted from the microprocessor 2 to the memory 1 through an address bus of 2n-bit width, respective contents of a pair of instruction registers R1 and R2 in the register 5 and an instruction M inputted to the microprocessor 2. FIG. 4 shows a 1-wait memory access operation, i.e., the memory access twice as slow as the processing performed by the microprocessor 2. FIG. 5 shows a 2-wait memory access. In these Figures, 1, 2 . . . of the address signal A represent the numbers of the address signals A, 1, 2 . . . of the registers R1 and R2 represent the instructions corresponding to 1, 2 . . . of the address signal A and 1, 2 . . . of the instruction M represent the numbers of the instructions read out from the registers R1 and R2.

As can be seen in FIG. 4, in the 1-wait memory access, no wait for reading the instructions from the registers R1 and R2 occurs in the microprocessor 2. On the other hand, in the 2-wait memory access as shown in FIG. 5, there occurs a wait in the microprocessor 2 as indicated by satin portion. In a waiting state, the microprocessor 2 holds its processing while it can not read the instructions from the registers. In occurrence of such a wait, any high-performance microprocessor 2 should require the time to read the instructions from the memory to the registers, thus causing degradation in its performance. As the difference in performance between the microprocessor 2 and the memory 1, i.e., the number of occurrences of wait increases, more and longer waits take place in the microprocessor 2. That is caused by a restricted number of registers in the bus controller 3 and a register having memory equivalent in size to the bus width that the microprocessor 2 can process.

In the first preferred embodiment, however, the instructions of (n×m)-bit bus width which is larger than the bus width that the microprocessor 6 can process are received by the group of queues 13, and therefore, there is no need of the microprocessor 6 to wait the period for reading the instructions from the memory 7 into the register 10 in the core 8. Furthermore, only necessary instructions out of those stored in the queue $13_p$ are outputted through the MUX 12 to the operation unit 9 in the core 8, and therefore, less frequent waits take place than that in the microprocessor 2 shown in FIG. 5. In the first preferred embodiment, the instructions of m times n bits are read into the microprocessor 6 in advance, and accordingly, there is no wait as shown in FIG. 4 and the instructions are outputted rapidly to the operation unit 9.

In the first preferred embodiment, it is preferable that the group of queues should include a plurality of queues $13_i$.

FIGS. 6A to 6F show an operation where only a queue $13_o$ of (n×m)-bit width is provided instead of the group of queues 13, corresponding to a case of p =1. In these figures, an exemplary, case of m=2 is shown. Instructions 1, 2, 3 and 4 each having n bits are given to the queue $13_o$ and further transmitted therefrom to the core 8. Two cycles of the clock signal are required for processing the instruction 1 and one cycle of the clock signal is required for processing any of the instructions 2, 3 and 4. The 2-wait memory access is performed.

Figure 6A:
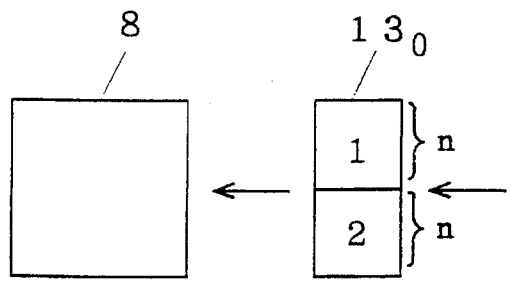
FIGS. 6A to 6F are views illustrating an operation performed by using a single queue.
Figure 6B:
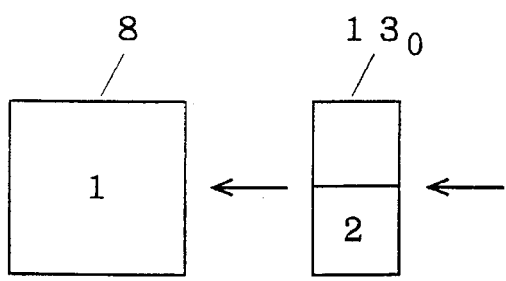
Figure 6C:
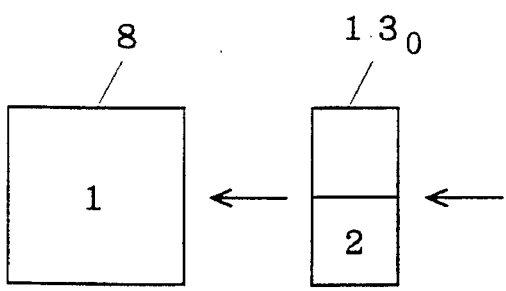
Figure 6D:
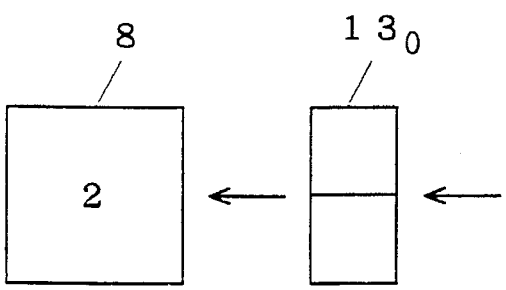
Figure 6E:
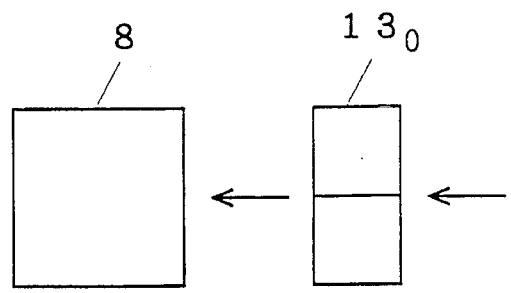
Figure 6F:
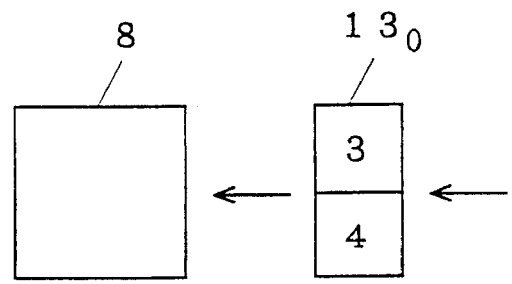

In a step of FIG. 6A, two instructions 1 and 2 have been stored in the queue $13_o$, and an processing on the instruction 1 starts in the core 8 in accordance with the next one cycle (FIG. 6B). The processing on the instruction 1 in the core 8 requires another one cycle to be completed (FIG. 6C). In accordance with the next one cycle, a processing on the instruction 2 is subsequently performed in the core 8, requiring only one cycle (FIG. 6D). On the other hand, no instruction is stored since the 2-wait memory access is performed, and accordingly, the core 8 is in a waiting state for one cycle (FIG. 6E). The instructions 3 and 4 are stored thereafter into the queue $13_o$ (FIG. 6F).

FIGS. 7A to 7F show an operation where the group of queues 13 includes two queues $13_1$ and $13_2$. Like the operation shown in 6A to FIG. 6F, two cycles of the clock signal are required for processing the instruction 1 and one cycle of the clock signal is required for processing any of the instructions 2, 3 and 4. The 2-wait memory access is performed.

Figure 7A:
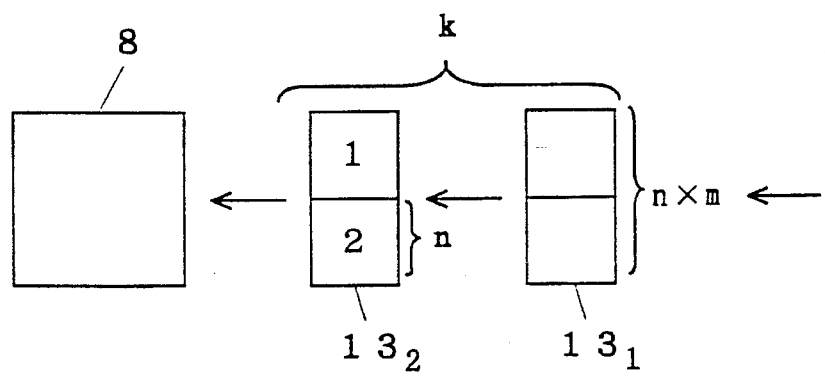
FIGS. 7A to 7F and 8A to 8F are views illustrating an operation in accordance with the first preferred embodiment of the present invention.
Figure 7B:
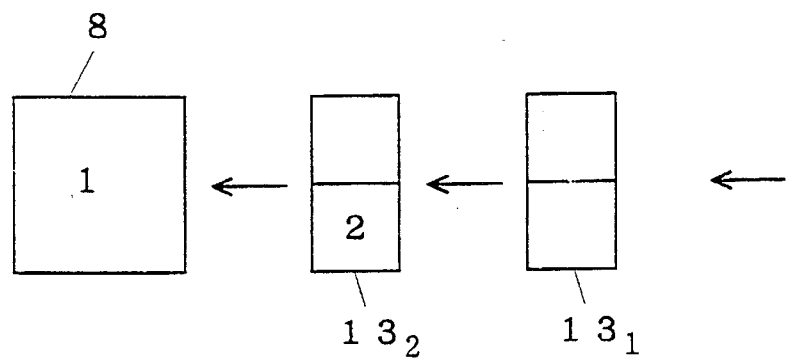
Figure 7C:
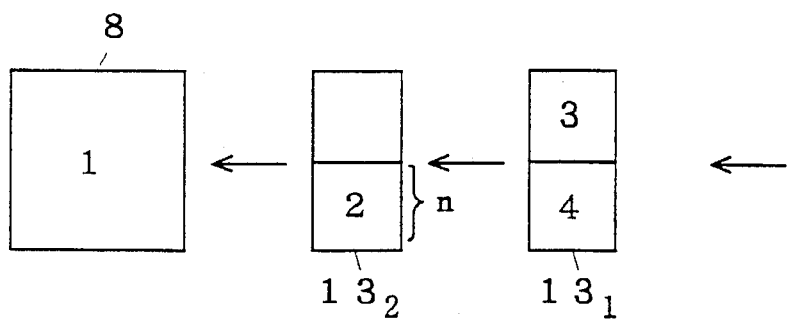
Figure 7D:
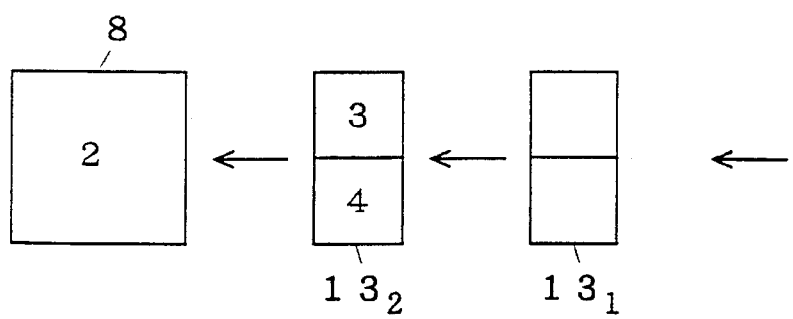
Figure 7E:
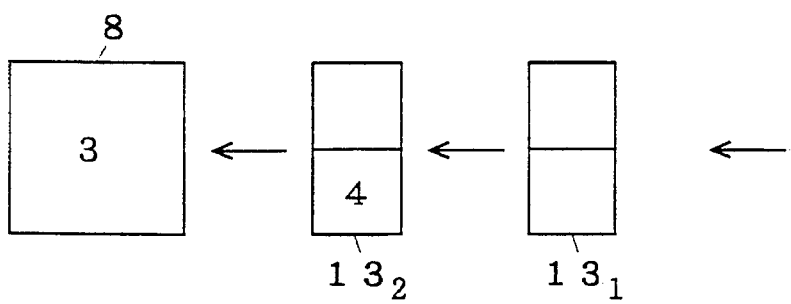
Figure 7F:
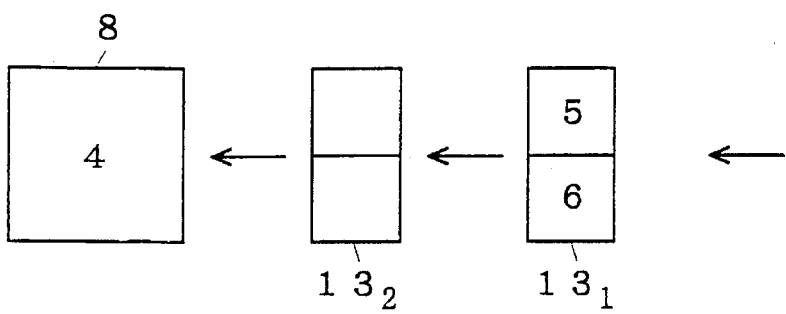
Figure 8A:
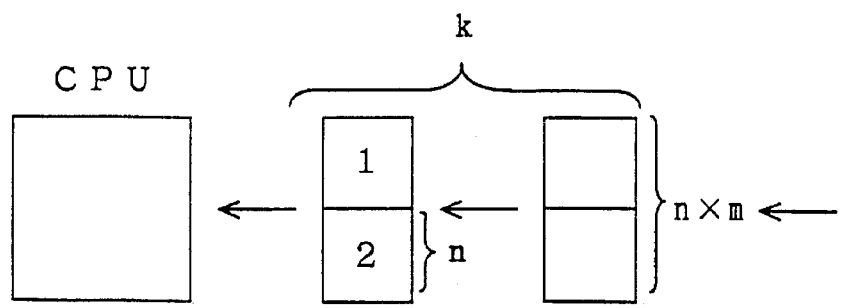
Figure 8B:
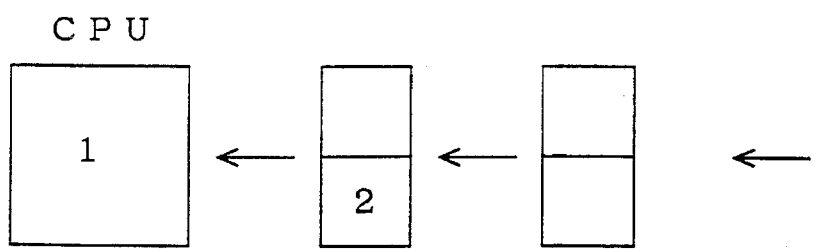
Figure 8C:
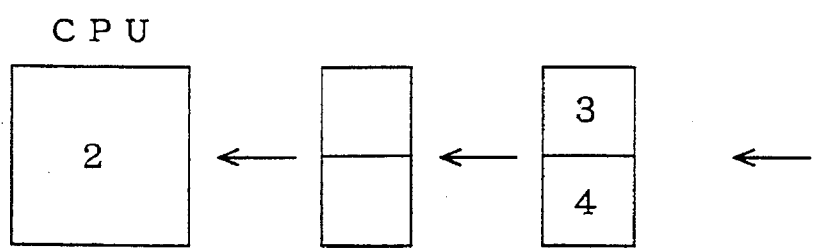
Figure 8D:
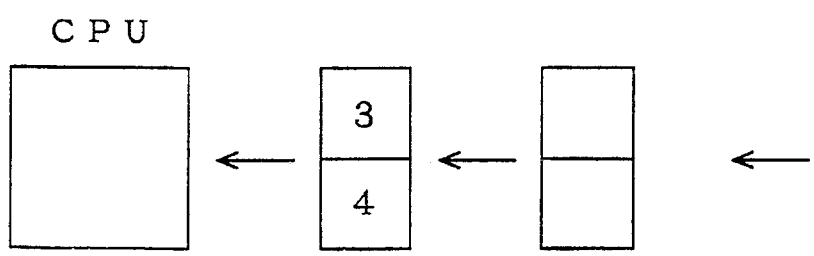
Figure 8E:
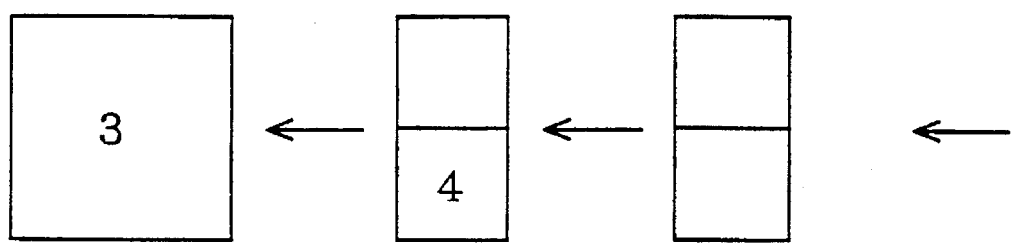
Figure 8F:
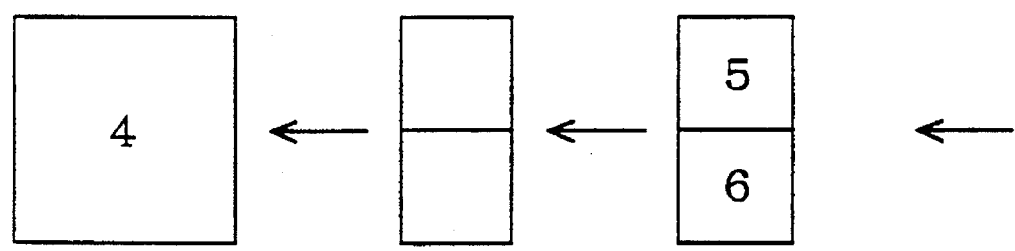

In a step of FIG. 7A, two instructions 1 and 2 have been stored in the queue $13_2$, and no instruction has been stored in the queue $13_1$ since the 2-wait memory access is performed. An processing on the instruction 1 starts in the core 8 in accordance with the next one cycle in a step of FIG. 7B. Also in the step of FIG. 7B, no instruction has been in the queue $13_1$. The processing on the instruction 1 requires another one cycle to be completed and, in this step, the instructions 3 and 4 are stored into the queue $13_1$ (FIG. 7C). In accordance with the next one cycle, a processing on the instruction 2 is performed in the core 8, and the instructions 3 and 4 are shifted from the queue $13_1$ to the queue $13_2$ (FIG. 7D). Since the processing on the instruction 2 requires one cycle to be completed, a processing on the instruction 3 is subsequently., performed in the core 8. In this step, no instruction is stored in the queue $13_1$ because of the 2-wait memory access (FIG. 7E). In accordance with another one cycle, a processing on the instruction 4 is performed in the core 8, the next instructions 5 and 6 are concurrently stored in the queue $13_1$ (FIG. 7F).

Thus, providing a plurality of queues $13_1$ and $13_2$ prevents the core 8 from entering the waiting state, thereby ensuring a rapid processing.

FIGS. 8A to 8F show an operation where the group of queues 13 includes a plurality of queues $13_1$ and $13_2$ and one cycle is required for processing each of the instructions 1, 2, 3 and 4 in the core 8. In this case, six cycles are needed to process all of the instructions 1, 2, 3 and 4. In other words, by providing a plurality of queues $13_1$ and $13_2$, the processing on the instruction 1 can be completed in the same period, whether two cycles or one cycle is required therefor. As discussed above, in the first preferred embodiment, instructions (or data), the amount of which is more than that of instructions (or data) to be processed in the microprocessor 6, can be stored in the queue $13_i$ at a time and therefore it is possible to reduce the time needed for actual memory access by a factor of m. Thus, the number of memory access can be reduced, thereby achieving high performance and less internal processing of the microprocessor 6 and less difference in speed between the processing of the microprocessor 6 and the memory access. In particular, providing a plurality of queues $13_i$ makes a great contribution to lessening the difference in operation speed between the microprocessor 6 and the memory 7. If the microprocessor 6 reads data from the memory 7 and the group of queues 13 so that the group of queues 13 may always store data, the microprocessor 6 should be prevented from degradation in its performance due to a load delay. In a case of the execution of branch instruction, since a branch-target instruction can be read from a specified queue $13_i$ among the group of queues 13, the microprocessor 6 can access the branch-target instruction more quickly than the background-art microprocessor. Moreover, it is easier to perform a dynamic scheduling. In addition, providing the group of queues 13 within the microprocessor 6 allows reduction in the number of components and ensures a lower manufacturing cost.

The Second Preferred Embodiment

Figure 9:
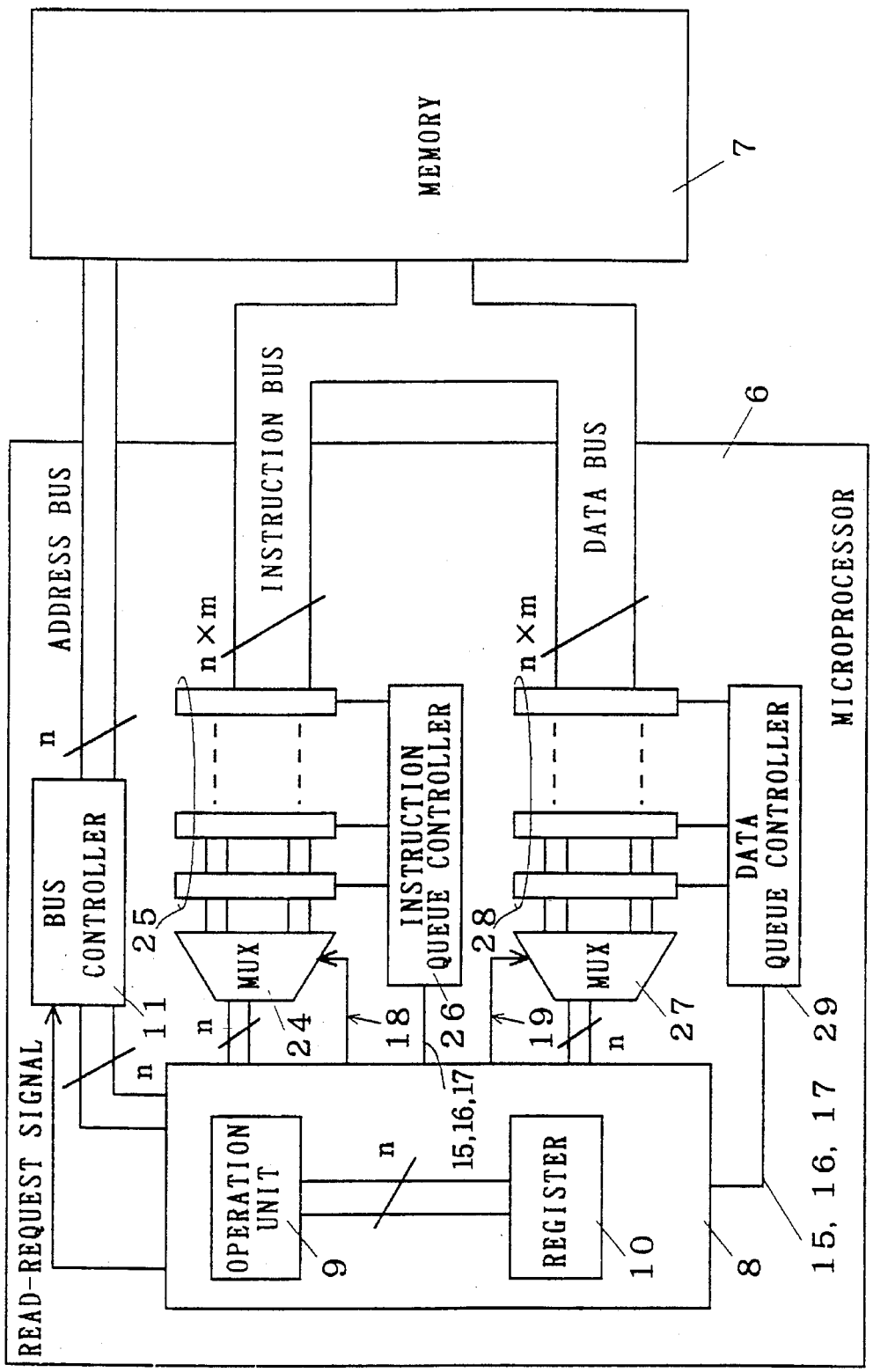
FIG. 9 is a circuit diagram showing a configuration of a semiconductor integrated circuit in accordance with a second preferred embodiment of the present invention.

FIG. 9 shows a configuration of a semiconductor integrated circuit in accordance with a second preferred embodiment. Reference numerals 6 to 11 denote the same elements as those of FIG. 1. The data bus of FIG. 1 is separated into an instruction bus and a data bus, to which groups of queues 25 and 28 are connected, respectively. The group of instruction queues 25 and the group of data queues 28 are connected on the other side to the core 8 through the MUXs 24 and 27, respectively. The MUX 24 selects the instructions transmitted through the group of instruction queues 25 and outputs n bits of the instructions to the core 8. The MUX 27 selects the data transmitted through the group of data queues 28 and outputs n bits of the data to the core 8. The group of instruction queues 25 and the group of data queues 28 each internally consists of a plurality of D flip flops, like the group of queues 13 of FIG. 2. The lowest queue (the nearest queue to the memory 7) of the group of instruction queues 25 is connected to the instruction bus and the lowest queue (the nearest queue to the memory 7) of the group of data queues 28 is connected to the data bus. The instruction queue controller 26 controls the group of instruction queues 25 in accordance with the control signals (the queue clear signal 15, the queue state signal 16 and the effectiveness signal 17 and the like) and the data queue controller 29 controls the group of data queues 28 in a like manner. Although the memory 7 has a single construction, it outputs (n×m)-bit instructions or data to a common bus, which branches out into the instruction bus and the data bus.

The microprocessor 6 outputs n-bit address signal to the memory 7 and receives (n×m)-bit instructions or data through the instruction bus or the data bus into the group of instruction queues 25 or the group of data queues 28, respectively. The instructions or data are read out from the memory 7 when the core 8 gives a read-request signal to a bus controller 11. The instructions or data begin to be read into the core 8 when the core 8 gives the control signals to the instruction queue controller 26 or the data queue controller 29 and gives a selection signal 18 or 19 to the MUX 24 or 27, respectively. The required instructions or data are read into the core 8 in an appropriate size from the uppermost queue (the nearest queue to the MUX 24) of the group of instruction queues 25 or the uppermost queue (the nearest queue to the MUX 27) of the group of data queues 28 through the MUX 24 or 27. For the purpose of identifying the output from the memory 7, whether instruction or data, the storage space in the memory 7 may be definitely divided into storage space for instruction and storage space for data. In this case, the address signal from the microprocessor 6 serves to determine whether instruction or data should be read out. Alternatively, the control signal from the microprocessor 6 may be useful.

As discussed above, in the second preferred embodiment, the microprocessor 6 has a configuration where the instruction queues and the data queues are internally separated, which allows instruction access and data access to be made independently from each other.

The Third Preferred Embodiment

Figure 10:
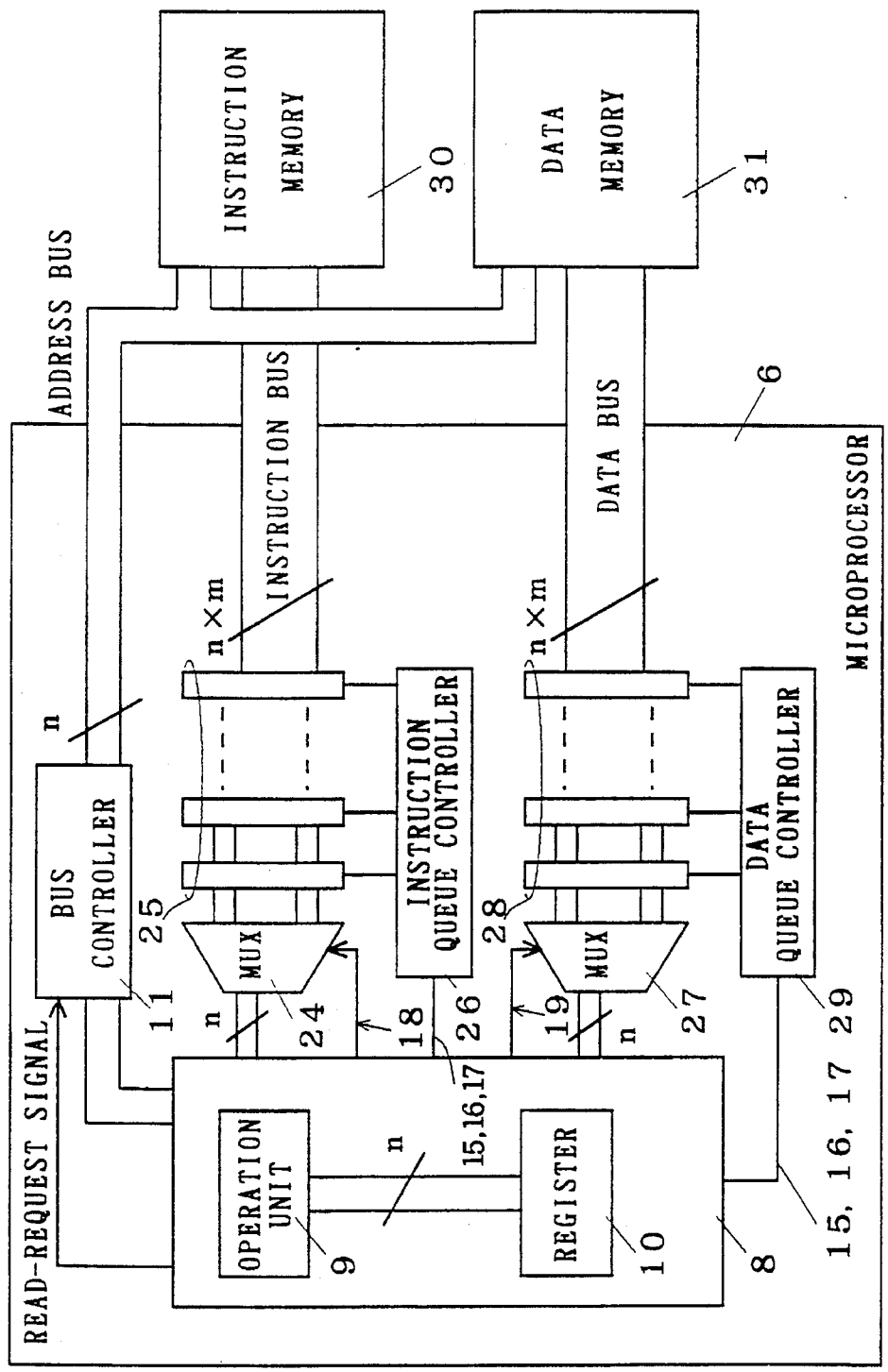
FIG. 10 is a circuit diagram showing a configuration of a semiconductor integrated circuit in accordance with a third preferred embodiment of the present invention.

FIG. 10 shows a configuration of a semiconductor integrated circuit in accordance with a third preferred embodiment. Reference numerals 6 to 11 and 24 to 29 denote the same elements as those of FIG. 9. The memory 7 is separated into an instruction memory 30 and a data memory 31. The instruction memory 30 is connected to the group of instruction queues 25 through the instruction bus of (n×m)-bit width, and the data memory 31 is connected to the group of data queues 28 through the data bus of (n×m)-bit width. The instruction memory 30 and the data memory 31 are connected to the bus controller 11 through the address bus of n-bit width in common. The instruction memory 30 and the data memory 31 operate independently from each other.

The microprocessor 6 outputs the n-bit address signal from the bus controller 11 to the instruction memory 30 or the data memory 31. The (n×m)-bit instructions are read out from the instruction memory 30 into the group of instruction queue 25 through the instruction bus, and the (n×m)-bit data are read out from the data memory 31 into the group of data queues 28 through the data bus. The instructions or data are read out from the instruction memory 30 or data memory 31 when the core 8 gives the read-request signal to the bus controller 11. The instructions or data begin to be read into the core 8 when the core 8 gives the control signals to the instruction queue controller 26 or the data queue controller 29 and gives the selection signal 18 or 19 to the MUX 24 or 27, respectively. The required instructions or data are read into the core 8 in an appropriate size from the uppermost queue (the nearest queue to the MUX 24) of the group of instruction queues 25 or the uppermost queue (the nearest queue to the MUX 27) of the group of data queues 28 through the MUX 24 or 27.

As discussed above, in the third preferred embodiment, the microprocessor 6 has a configuration where the instruction queues and the data queues are internally separated, which allows instruction access and data access to be made independently from each other. Therefore, it becomes possible to prevent the instruction access and data access from competing with each other. Since the instruction memory 30 and the data memory 31 are separately provided, the instruction memory 30 may be provided within the microprocessor 6 if the program is small in size. Moreover, a memory of small capacity produces an effect of improving the access speed.

The Fourth Preferred Embodiment

Figure 11:
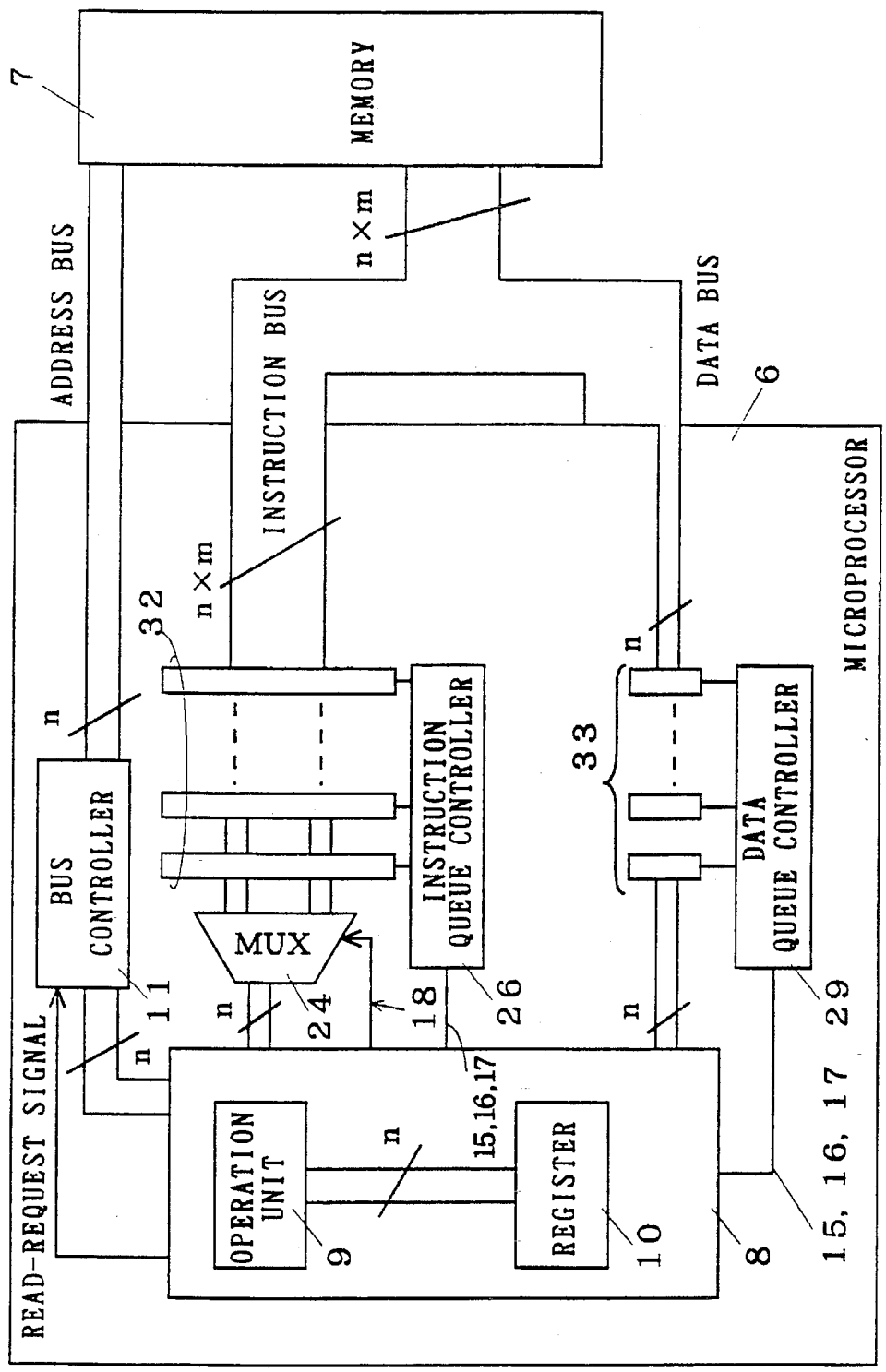
FIG. 11 is a circuit diagram showing a configuration of a semiconductor integrated circuit in accordance with a fourth preferred embodiment of the present invention.

FIG. 11 shows a configuration of a semiconductor integrated circuit in accordance with a fourth preferred embodiment. Reference numerals 6 to 11, 24, 26 and 29 denote the same elements as those of FIG. 9. A group of instruction queues 32 consists of a plurality of queues serially connected and each of the queues stores instructions of m times n bits (n×m bits) when the microprocessor 6 can process n-bit instruction at a time. A group of data queues 33 consists of a plurality of queues serially connected and each of the queues stores data of n bits that the microprocessor 6 can process at a time.

In the fourth preferred embodiment, only the instruction bus connected to the group of instruction queues 32 has an (n×m)-bit width which is larger than the internal bus width of the microprocessor 6. On the other hand, the data bus of n-bit width which is as large as the internal bus width of the microprocessor 6 out of the data bus of (n×m)-bit width is connected to the group of data queues 33. The group of data queues 33 has a construction to store dater of n-bit width. Specifically, each queue of the group of data queues 33 consists of n D flip flops. The n-bit data transmitted through the group of data queues 33 are outputted directly to the core 8 not through the MUX. Although a common bus is used for connecting the instruction bus and the data bus with the memory 7, unnecessary.; bits of the data bus other than n bits are not received by the microprocessor 6. The unnecessary bits of the data bus may be kept open or may be selected by a multiplexer. The operation for reading the instruction or data from the memory 7 into the microprocessor 6 and the operation of the microprocessor 6 for reading the instruction or data into the core 8 are the same as those of the second preferred embodiment, and discussion thereof will be omitted.

The fourth preferred embodiment, constructed as above, allows a smaller-sized group of data queues 33 to be used, and therefore produces an effect of reducing the circuit scale of the semiconductor integrated circuit.

The Fifth Preferred Embodiment

Figure 12:
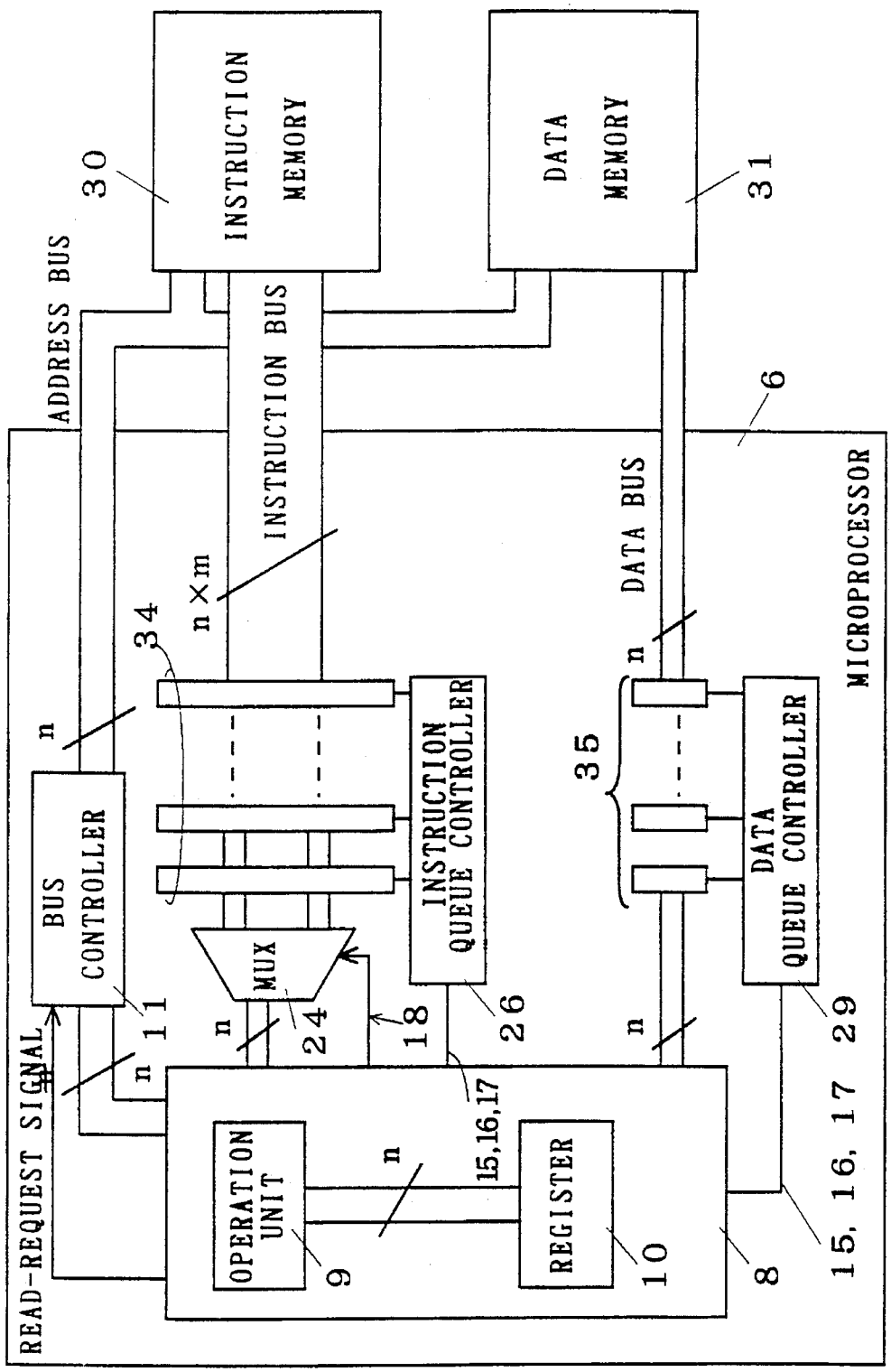
FIG. 12 is a circuit diagram showing a configuration of a semiconductor integrated circuit in accordance with a fifth preferred embodiment of the present invention.

FIG. 12 shows a configuration of a semiconductor integrated circuit in accordance with a fifth preferred embodiment. Reference numerals 6 to 11, 24, 26 and 29 to 31 denote the same elements as those of FIG. 10. Each queue of a group of instruction queues 34 stores instructions of m times n bits (n×m bits) when the microprocessor 6 can process n-bit instruction at a time. Each queue of a group of data queues 35 stores data of n bits that the microprocessor 6 can process at a time.

In the fifth preferred embodiment, the memory is separated into the instruction memory 30 and the data memory 31. The instruction bus connected to the group of instruction queues 34 has an (n×m)-bit width which is larger than the internal bus width of the microprocessor 6, and the data bus connected to the group of data queues 35 has an n-bit width which is as large as the internal bus width of the microprocessor 6. The group of data queues 35 has a construction to store data of n-bit width. Specifically, each queue of the group of data queues 35 consists of n D flip flops. The n-bit data transmitted through the group of data queues 35 are outputted directly to the core 8 not through the MUX. The operation for reading the instruction or data from the memory 7 into the microprocessor 6 and the operation of the microprocessor 6 for reading the instruction or data into the core 8 are the same as those of the third preferred embodiment, and discussion thereof will be omitted.

The fifth preferred embodiment, constructed as above, allows a smaller-sized group of data queues 35 to be used, and therefore produces an effect of reducing the circuit scale of the semiconductor integrated circuit.

The Sixth Preferred Embodiment

Figure 13:
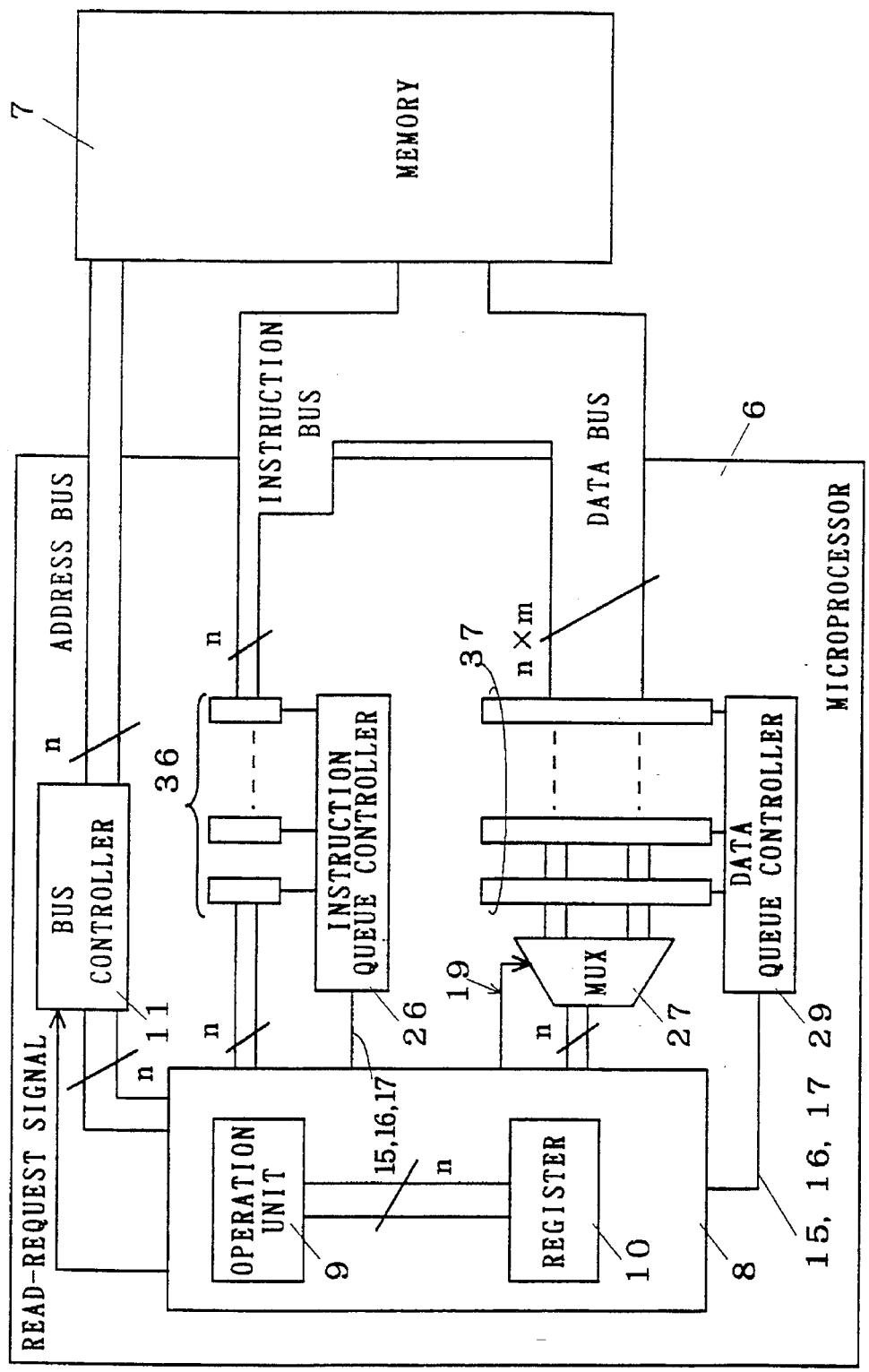
FIG. 13 is a circuit diagram showing a configuration a semiconductor integrated circuit in accordance with a sixth preferred embodiment of the present invention.

FIG. 13 shows a configuration of a semiconductor integrated circuit in accordance with a sixth preferred embodiment. Reference numerals 10 to 11, 26, 27 and 29 denote the same elements as those of the second preferred embodiment. Each queue of a group of instruction queues 36 stores instructions of n bits that the microprocessor 6 can process at a time. Each queue of a group of data queues 37 stores data of m times n (n×m) bits when the microprocessor 6 can process n-bit data at a time.

In the sixth preferred embodiment, only the data bus connected to the group of data queues 37 has an (n×m)-bit width which is larger than the internal bus width of the microprocessor 6. On the other hand, the instruction bus of n-bit width which is as large as the internal bus width of the microprocessor 6 is connected to the group of instruction queues 36 and the remaining bits of the instruction bus is connected nowhere but kept open. The memory 7 has a single construction and the instructions and data are separated when outputted to the groups of queues 36 and 37. The group of instruction queues 36 has a construction to store instructions of n-bit width. Specifically, each queue of the group of instruction queues 36 consists of n D flip flops. The n-bit instruction transmitted through the group of instruction queues 36 are outputted directly to the core 8 not through the MUX. Although a common bus is used for connecting the instruction bus and the data bus with the memory 7, unnecessary bits of the instruction bus other than n bits are not received by the microprocessor 6. The unnecessary bits of the instruction bus may be kept open or may be selected by a multiplexer. The operation for reading the instruction or data from the memory 7 into the microprocessor 6 and the operation of the microprocessor 6 for reading the instruction or data into the core 8 are the same as those of the second preferred embodiment.

The sixth preferred embodiment, constructed as above, allows a smaller-sized group of instruction queues 36 to be used, and therefore produces an effect of reducing the circuit scale of the semiconductor integrated circuit.

The Seventh Preferred Embodiment

Figure 14:
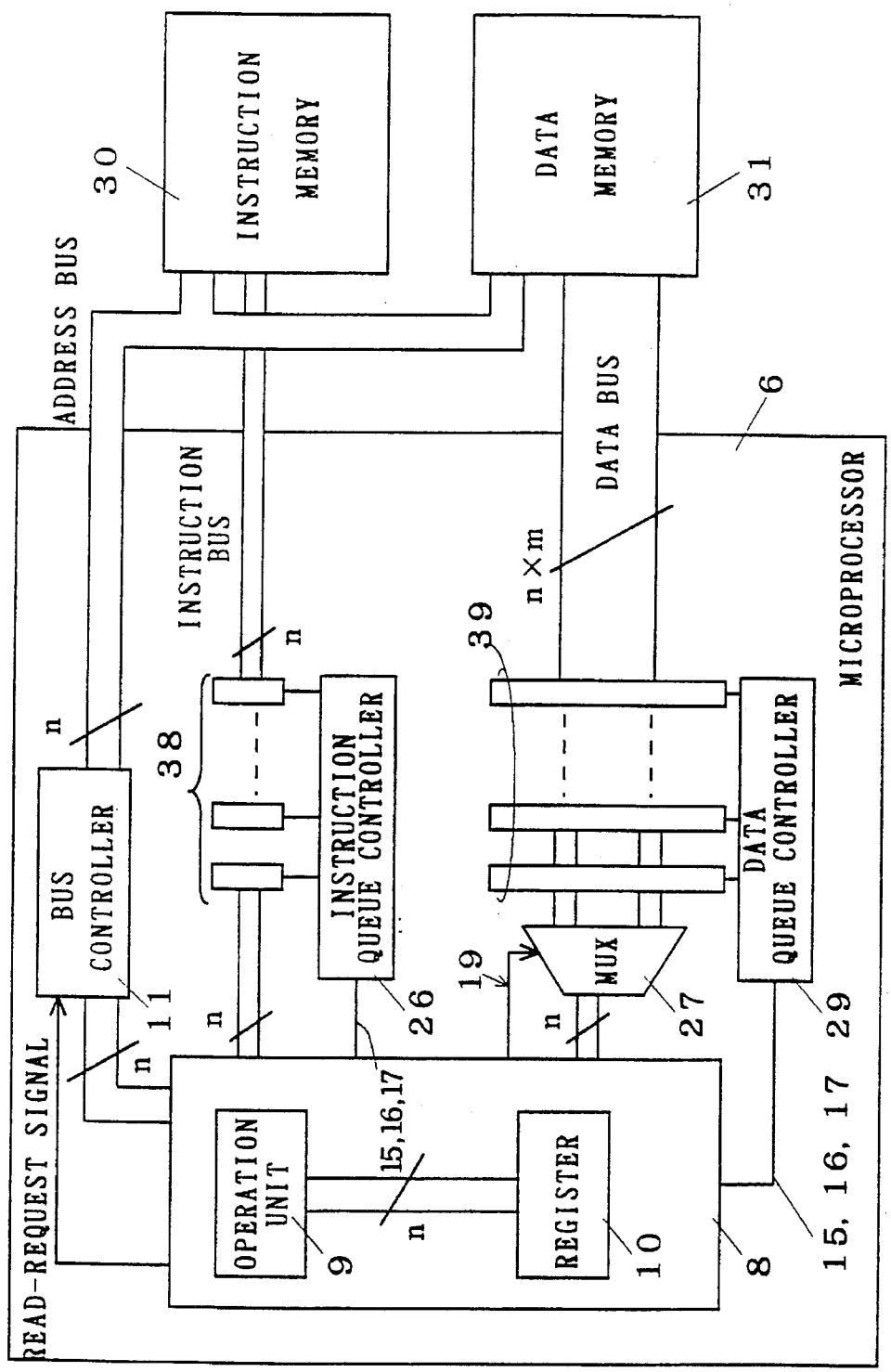
FIG. 14 is a circuit diagram showing a configuration of a semiconductor integrated circuit in accordance with a seventh preferred embodiment of the present invention.

FIG. 14 shows a configuration of a semiconductor integrated circuit in accordance with a seventh preferred embodiment. Reference numerals 6 to 11, 26, 27 and 29 to 31 denote the same elements as those of FIG. 10. A group of instruction queues 38 consists of a plurality of queues serially connected and each of the queues stores instructions of n bits that the microprocessor 6 can process at a time. A group of data queues 39 consists of a plurality of queues serially connected and each of the queues stores data of m times n bits (n×m bits) when the microprocessor 6 can process n-bit data at a time.

In the seventh preferred embodiment, the memory is separated into the instruction memory 30 and the data memory 31. Only the data bus connected to the group of data queues 39 has an (n×m)-bit width which is larger than the internal bus width of the microprocessor 6 and the instruction bus connected to the group of instruction queues 38 has an n-bit width which is as large as the internal bus width of the microprocessor 6. The group of instruction queue 38 has a construction to store instructions of n-bit width. Specifically, each queue of the group of instruction queues 38 consists of n D flip flops. The n-bit instructions transmitted through the group of instruction queues 38 are outputted directly to the core 8 not through the MUX. The operation for reading the instruction or data from the memory 7 into the microprocessor 6 and the operation of the microprocessor 6 for reading the instruction or data into the core 8 are the same as those of the third preferred embodiment, and discussion thereof will be omitted.

The seventh preferred embodiment, constructed as above, allows a smaller-sized group of instruction queues 38 to be used when the memory 7 is separated into the instruction memory 30 and the data memory 31, and therefore produces an effect of reducing the circuit scale of the semiconductor integrated circuit.

The Eighth Preferred Embodiment

Figure 15:
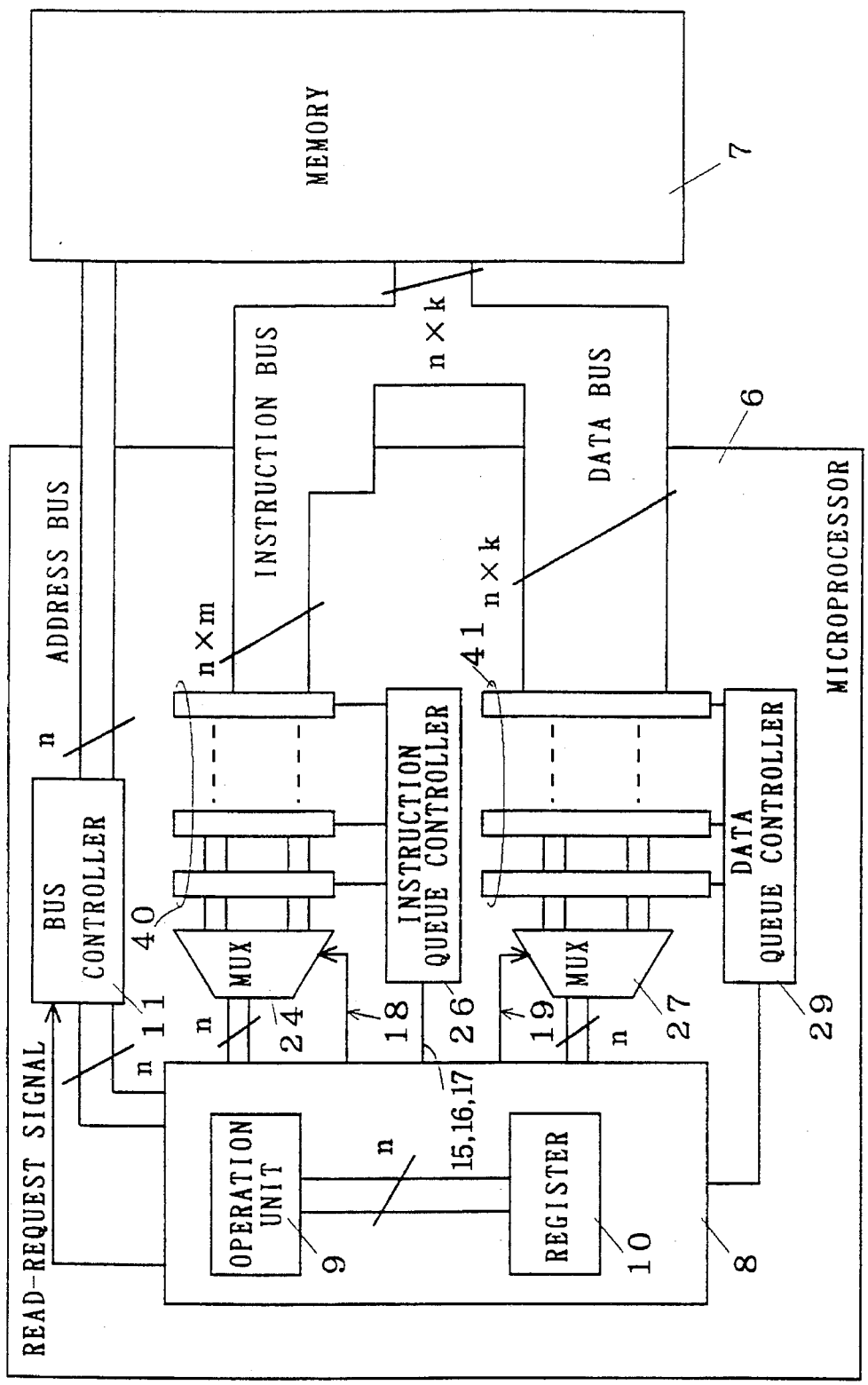
FIG. 15 is a circuit diagram showing a configuration of a semiconductor integrated circuit in accordance with an eighth preferred embodiment of the present invention.

FIG. 15 shows a configuration of a semiconductor integrated circuit in accordance with an eighth preferred embodiment. Reference numerals 6 to 11, 24, 26, 27 and 29 denote the same elements as those of FIG. 9. A group of instruction queues 40 consists of a plurality of queues serially connected and each of the queues stores instructions of m times n bits (n×m bits) when the microprocessor 6 can process n-bit instruction at a time. A group of data queues 41 consists of a plurality of queues serially connected and each of the queues stores data of k times n bits (n×k bits), assuming k>m>1.

In the eighth preferred embodiment, the instruction bus connected to the group of instruction queues 40 has an (n×m)-bit width which is m times the internal bus width of the microprocessor 6, and the data bus connected to the group of data queues 41 has an (n×k)-bit width which is k times (k>m) the internal bus width of the microprocessor 6. For example, when the bus width that the microprocessor 6 can process at a time is 8 bits, instructions of 16-bit width which is twice the bus width that the microprocessor 6 can process at a time are read from the memory 7 into the group of instruction queues 40 and data of 24-bit width which is triple are read from the memory 7 into the group of data queues 41. The group of data queues 41 has a construction to store data of (n×k)-bit width read out from the memory 7. Specifically, each queue of the group of data queues 41 consists of (n×k) D flip flops. The memory 7 and the microprocessor 6 are connected with a common bus of (n×k)-bit width. The instructions and data are transmitted to the microprocessor 6 through the common bus. Only the required (n×m) bits of instructions are read from the instruction bus into the group of instruction queues 40. The rest of the instruction bus is kept open. Although the memory 7 has a single construction, the instructions and data are separated when inputted to the group of instruction queues 40 and the group of data queues 41, respectively. The operation for reading the instruction or data from the memory 7 into the microprocessor 6 and the operation of the microprocessor 6 for reading the instruction or data into the core 8 are the same as those of the second preferred embodiment.

The eighth preferred embodiment, constructed as above, allows more amount of data to be stored in the group of data queues 41, and therefore achieves an easy dynamic scheduling and improvement in performance of the semiconductor integrated circuit.

The Ninth Preferred Embodiment

Figure 16:
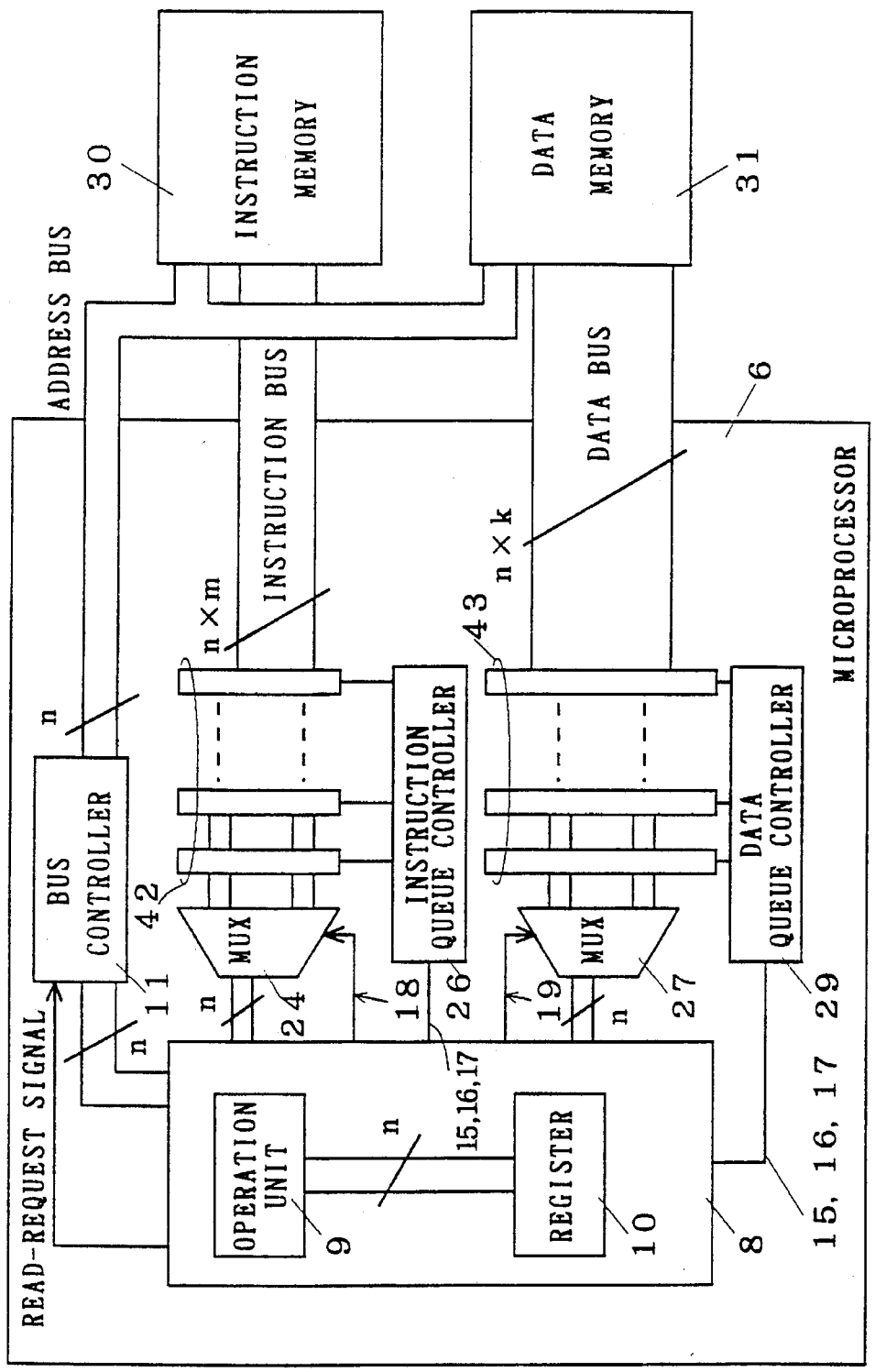
FIG. 16 is a circuit diagram showing a configuration of a semiconductor integrated circuit in accordance with a ninth preferred embodiment of the present invention.

FIG. 16 shows a configuration of a semiconductor integrated circuit in accordance with a ninth preferred embodiment. Reference numerals 6 to 11, 24, 26, 27 and 29 to 31 denote the same elements as those of FIG. 11). A group of instruction queues 42 consists of a plurality of queues serially connected and each of the queues stores instructions of m times n bits (n×m bits) when the microprocessor 6 can process n-bit instruction at a time. A group of data queues 43 consists of a plurality of queues serially connected and each of the queues stores data of k times n bits (n×k bits), assuming k>m>1.

In the ninth preferred embodiment, the memory 7 is separated in the instruction memory 30 and the data memory 31. The instruction memory 30 is connected to the group of instruction queues 42 through the instruction bus of (n×m)-bit width. The data memory 31 is connected to the group of data queues 43 through the data bus of (n×k)-bit width. The instruction memory 30 and the data memory 31 are connected to the bus controller 11 through the address bus of n-bit width. Each queue of the group of instruction queues 42 has (n×m) D flip flops and each queue of the group of data queues 43 has (n×k) D flip flops. The operation for reading the instruction or data from the memory 7 into the microprocessor 6 and the operation of the microprocessor 6 for reading the instruction or data into the core 8 are the same as those of the third preferred embodiment.

In the ninth preferred embodiment, constructed as above, the microprocessor 6 can make accesses to the instruction bus and the data bus in the respective bus widths when the memory is separated into the instruction memory 30 and the data memory 31, and therefore a well-balanced configuration can be achieved depending on the amount of data to be processed for control, image processing and the like.

The Tenth Preferred Embodiment

Figure 17:
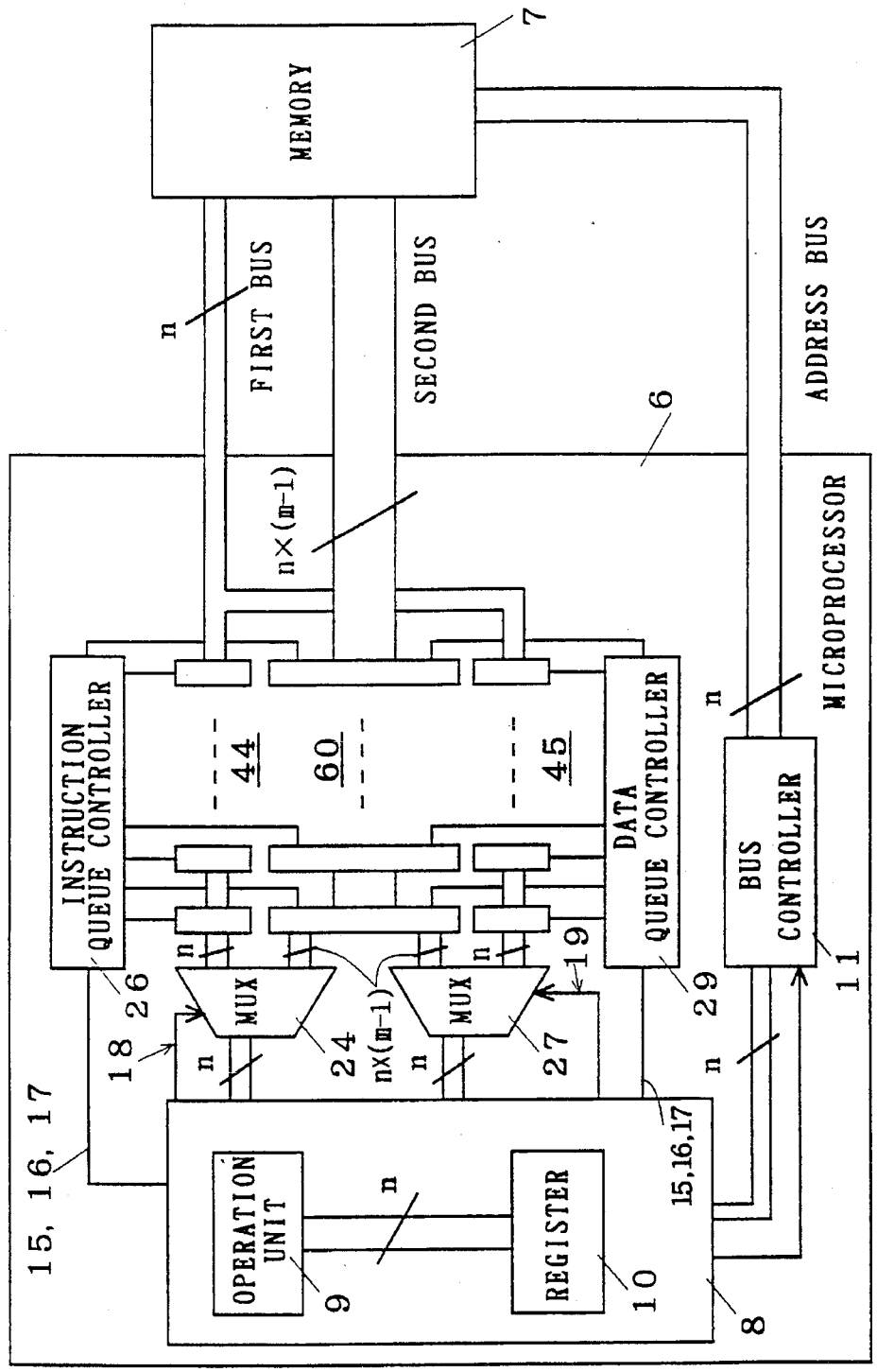
FIG. 17 is a circuit diagram showing a configuration of a semiconductor integrated circuit in accordance with a tenth preferred embodiment of the present invention.

FIG. 17 shows a configuration of a semiconductor integrated circuit in accordance with a tenth preferred embodiment. Reference numerals 6 to 11, 24, 26, 27 and 29 denote the same elements as those of FIG. 9. A group of instruction queues 44 consists of a plurality of queues serially connected and each of the queues stores instructions of n bits that the microprocessor 6 can process at a time. A group of data queues 45 consists of a plurality of queues serially connected and each of the queues stores data of n bits that the microprocessor 6 can process at a time. A group of common queues 60 consists of a plurality of queues serially connected and each of the queues stores n×(m−1) bits of instructions or data. The group of common queues 60 are controlled by both the instruction queue controller 26 and the data queue controller 29.

In the tenth preferred embodiment, (n×m)-bit instructions or data are outputted from the memory 7, and n bits of the instructions or data out of (n×m) bits are transmitted through the first bus to the group of instruction queues 44 or the group of data queues 45 in the microprocessor 6 and the remaining n×(m−1) bits of instructions or data are transmitted through the second bus to the group of common queues 60 in the microprocessor 6. The microprocessor 6 gives the read-request signal for instructions or data to the bus controller 11 when execution of a branch instruction requires a new branch-target instruction or whenever instructions or data are required according to the storage condition (in other words, according to the processing condition). Whether the instructions (data) from the memory 7 should be transmitted to the microprocessor 6 through the first bus or through the second bus is determined in accordance with the read-request signal from the microprocessor 6.

As discussed above, the tenth preferred embodiment, in which the group of common queues 60 and the second bus connecting the group of common queues 60 to the memory 7 are additionally provided, enables an efficient internal processing of the microprocessor 6 in accordance with the data access condition.

The Eleventh Preferred Embodiment

Figure 18:
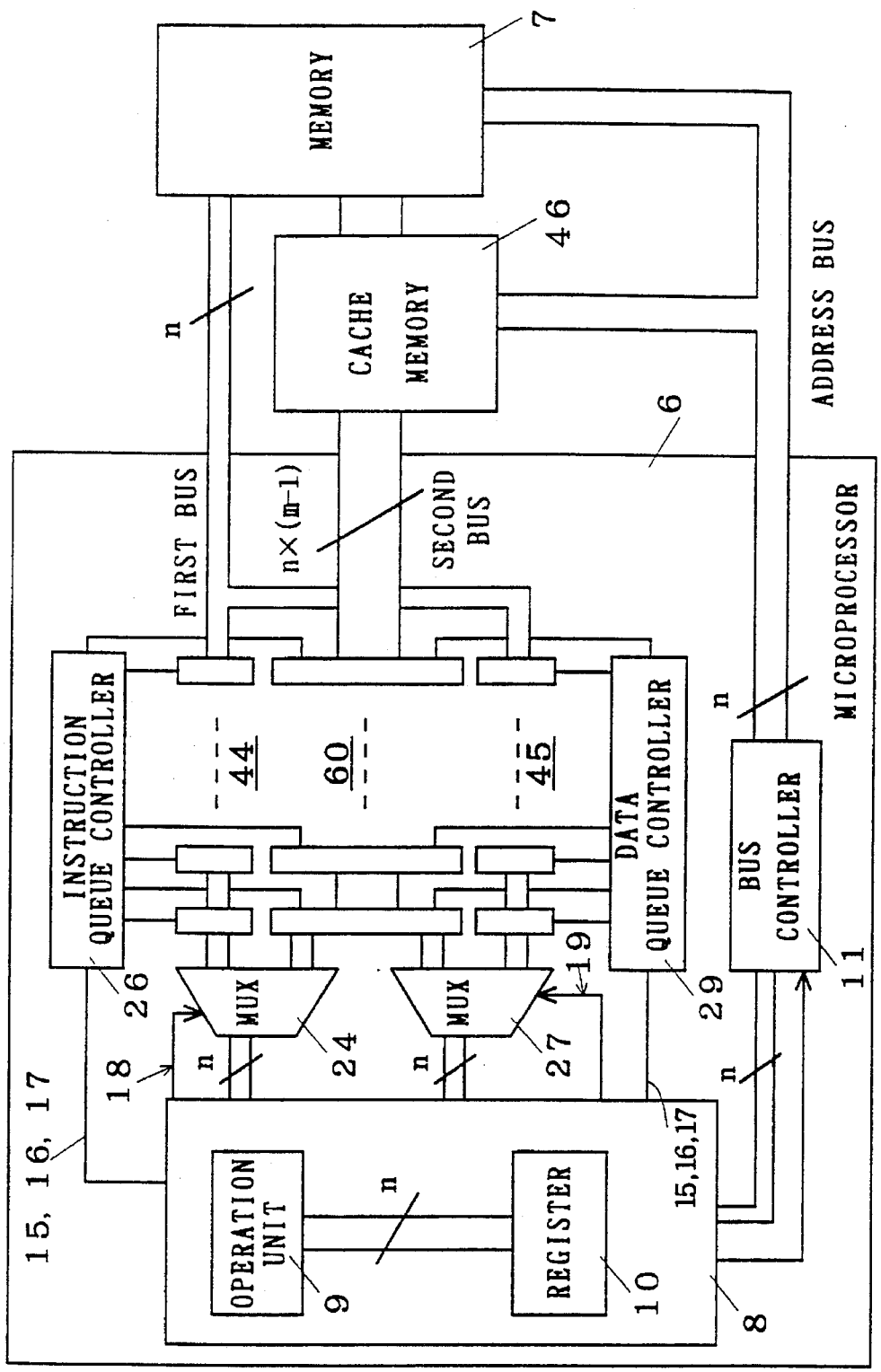
FIG. 18 is a circuit diagram showing a configuration of a semiconductor integrated circuit in accordance with an eleventh preferred embodiment of the present invention.

FIG. 18 shows a configuration of a semiconductor integrated circuit in accordance with an eleventh preferred embodiment. Reference numerals 6 to 11, 24, 26, 27 and 29 denote the same elements as those of FIG. 9. The eleventh preferred embodiment includes the group of common queues 60, the first bus and the second bus like the tenth preferred embodiment. Furthermore, a cache memory 46 is provided between the memory 7 and the microprocessor 6. The cache memory 46 is a memory of smaller capacity and of higher speed as compared with the memory 7 and is so connected that the instructions or data stored in the cache memory 46 may be transmitted through the second bus to the microprocessor 6.

The microprocessor 6 gives the read-request signal and the address signal to the bus controller 11, and the bus controller 11 gives the address signal to the cache memory 46. Then, the instruction or data located at the address of the cache memory 46 specified by the address signal are outputted to the microprocessor 6. When not found in the cache memory 46 (cache miss), the instruction or data are read out from the memory 7 into the cache memory 46 and then outputted to the microprocessor 6. The technique for reading the instruction or data from the memory 7 into the cache memory 46 when they are not found in the cache memory 46 is well known, and discussion thereof is omitted.

As discussed above, the eleventh preferred embodiment, in which the cache memory is additionally provided, allows instruction access or data access to be made at higher speed, and accordingly ensures high-speed operation of the semiconductor integrated circuit.

The Twelfth Preferred Embodiment

Figure 19:
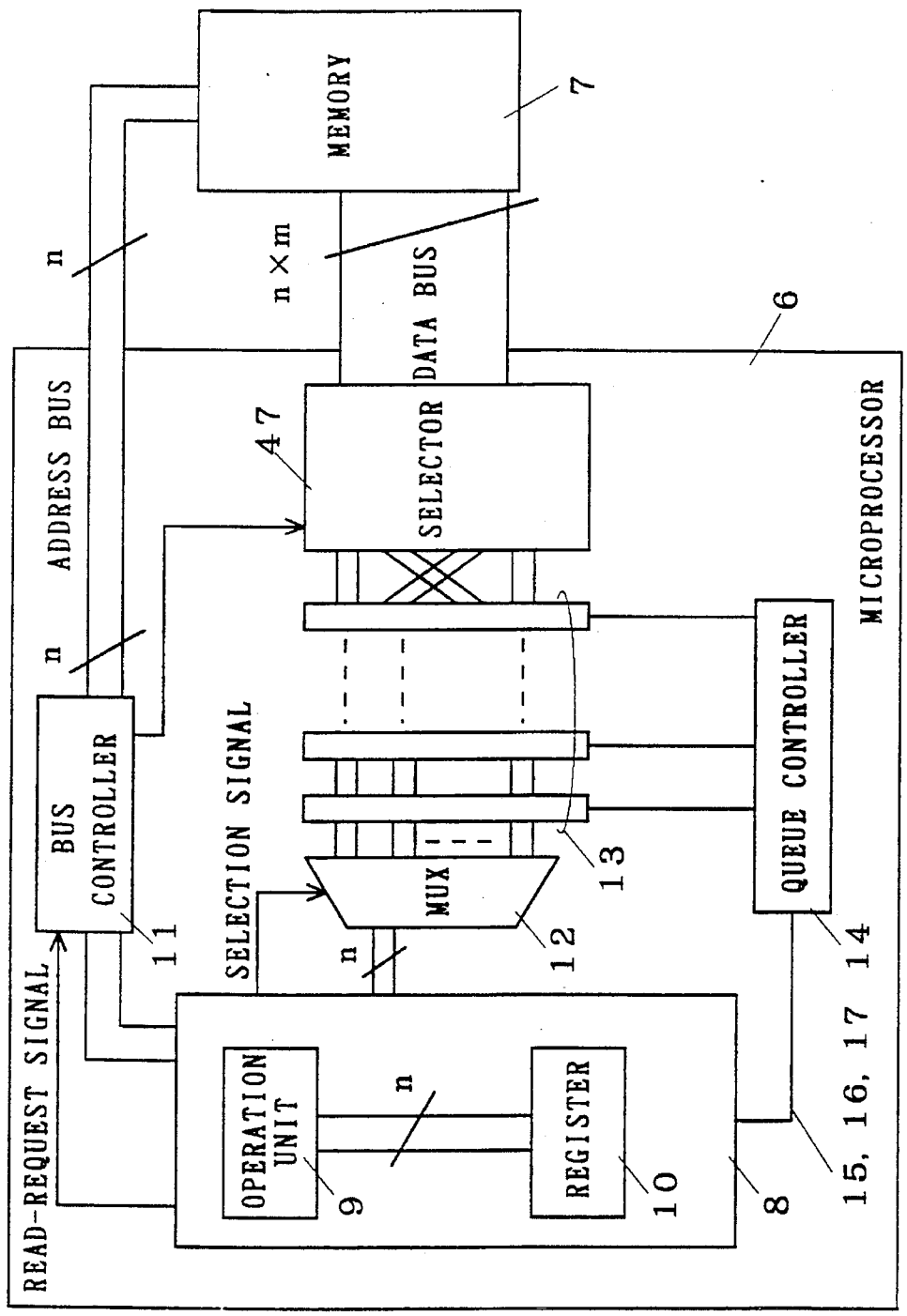
FIG. 19 is a circuit diagram showing a configuration of a semiconductor integrated circuit in accordance with a twelfth preferred embodiment of the present invention.

FIG. 19 shows a configuration of a semiconductor integrated circuit in accordance with a twelfth preferred embodiment. Reference numerals 6 to 14 denote the same elements as those of FIG. 1. A selector 47 receives (n×m)-bit instructions or data from the data bus and outputs them to the group of queues 13.

Figure 20A:
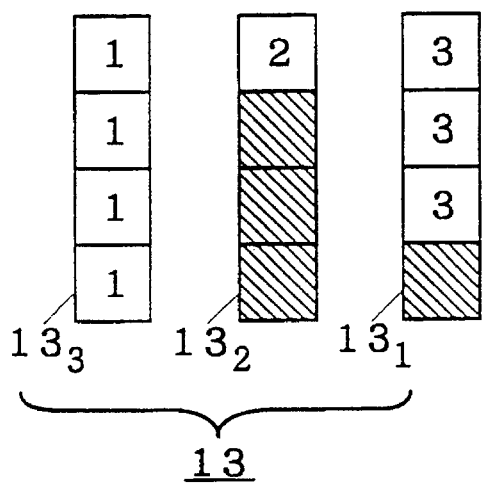
FIGS. 20A and 20B are views illustrating the states where a group of queues 13 store variable-length instructions or variable-length data.

The twelfth preferred embodiment enables an efficient transmission of variable-length instructions or data to the group of queues 13 by utilizing a function of the selector 47. For example, as shown in FIG. 20A, when 4-byte instruction (data) 1, 1-byte instruction (data) 2 and 3-byte instruction (data) 3 are sequentially transmitted from the memory 7 to the group of queues 13 which can store 4-byte instruction or data, there are free spaces (indicated by the hatching portions) in the queues $13_2$ and $13_1$.

Figure 20B:
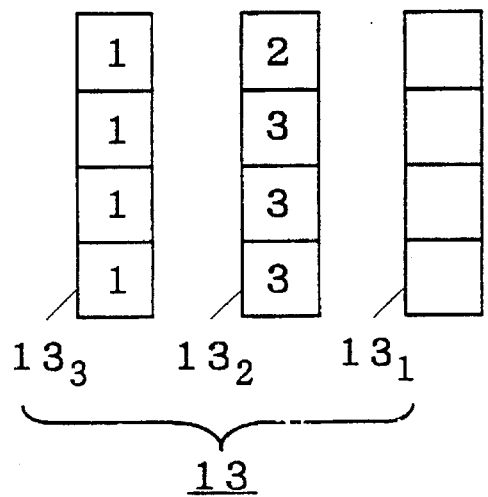

The use of the selector 47 makes it possible to store the instructions or data from the memory 7 into the group of queues 13 in response to the vacancy of the queues, as shown in FIG. 20B. The selector 47 is controlled in such a way as follows. The queue controller 14 gives information regarding the free space of the queue $13_1$, i.e., storage condition of the D flip flops to the microprocessor 6. The microprocessor 6 makes a judgment as to whether or not the instructions or data from the memory 7 can be stored in the free space of the queue $13_1$, on the basis of the information regarding the queue $13_1$ given by the queue controller 14 and the number of bytes of the variable-length instruction or data from the memory 7, and outputs the judgment result to the bus controller 11. When the queue $13_1$ can not store the instructions or data, the queue controller 14, receiving the judgment result from the bus controller 11, shifts the instructions or data stored in the queue $13_1$ to the next queue $13_2$ and clears the queue $13_1$. When the queue $13_1$ can store the instructions or data from the memory 7, the bus controller 11, receiving the judgment result from the core 8, gives a permission signal to the selector 47. Receiving the permission signal, the selector 47 determines an available position of the queue $13_1$ and transmits the instructions or data from the memory 7 to the position. When the bus controller 11 gives no permission signal to the selector 47, the instructions or data from the memory 7 are stored into the queue $13_1$ after it is cleared by the queue controller 14 as discussed above.

Figure 21:
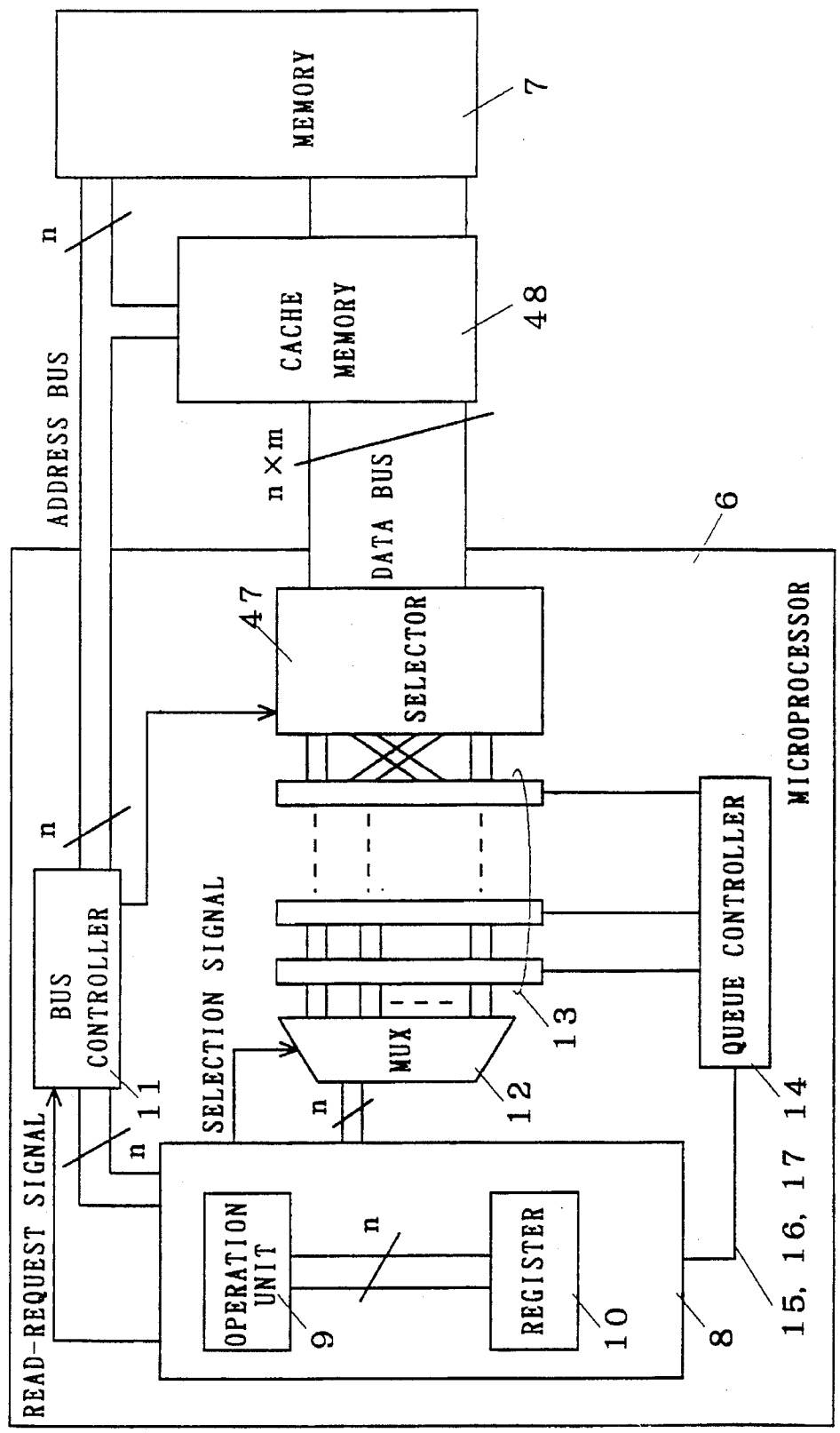
FIG. 21 is a circuit diagram showing a configuration where a cache memory 48 is interposed between the microprocessor 6 and a memory 7.

Furthermore, a cache memory 48 may be provided between the microprocessor 6 and the memory 7, as shown in FIG. 21. In the semiconductor integrated circuit of FIG. 21 having such construction, the microprocessor 6 can read the (n×m)-bit instructions or data from the cache memory 48 into the group of queues 13 more rapidly as compared with the semiconductor integrated circuit of FIG. 19. When the instructions or data are not found in the cache memory 48, such a control is exercised by the microprocessor 6 that the (n×m)-bit instructions or data may be read from the memory 7 into the cache memory 48 and further transmitted to the group of queues 13 in the microprocessor 6.

As discussed above, the twelfth preferred embodiment, in which the selector 47 is additionally provided, makes an efficient use of the group of queues 13 for variable-length instructions or data. Furthermore, providing the cache memory 48 ensures a high-speed operation of the semiconductor integrated circuit.

The Thirteenth Preferred Embodiment

Figure 22:
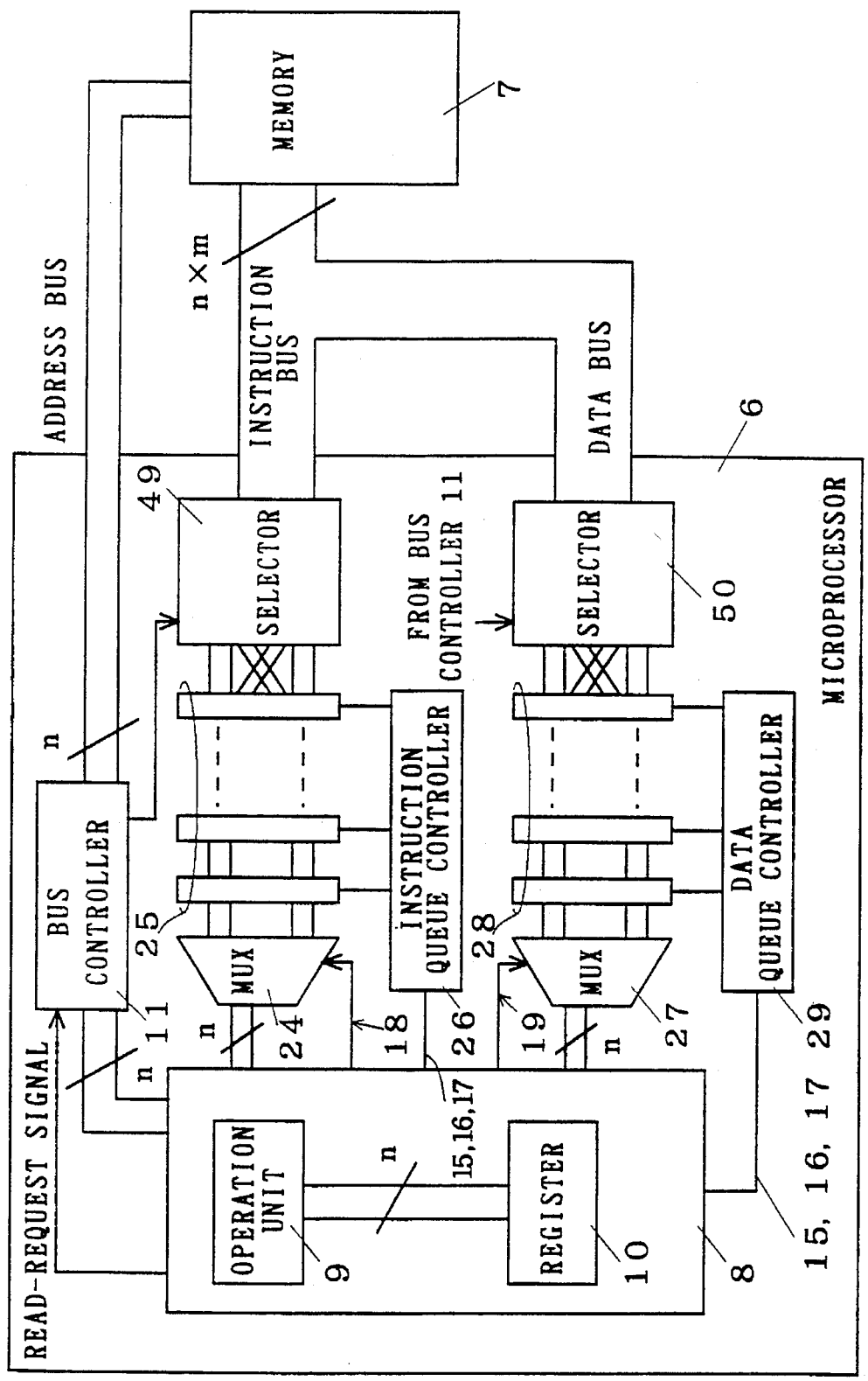
FIG. 22 is a circuit diagram showing a configuration of a semiconductor integrated circuit in accordance with a thirteenth preferred embodiment of the present invention.

FIG. 22 shows a configuration of a semiconductor integrated circuit in accordance with a thirteenth preferred embodiment. In the thirteenth preferred embodiment, selectors 49 and 50 are additionally provided in the semiconductor integrated circuit of FIG. 9. The selector 49 is connected to the memory 7 through an instruction bus of (n×m)-bit width and the selector 50 is connected to the memory 7 through a data bus of (n×m)-bit width. The selector 49 is connected on the other side to a queue of the group of the instruction queues 25 that is the nearest one to the memory 7 and the selector 50 is connected on the other side to a queue of the group of data queues 28 that is the nearest one to the memory 7. The variable-length instructions or data from memory 7 are inputted through the instruction bus or data bus to the selector 49 or selector 50. Like the selector 47 of FIG. 19, the selector 49 or selector 50 transmits the variable-length instructions or data from the memory 7 to the group of instruction queues 25 or data queues 28 in response to the vacancy of the nearest queue of the instruction queues 25 or data queues 28 to the memory 7.

Figure 23:
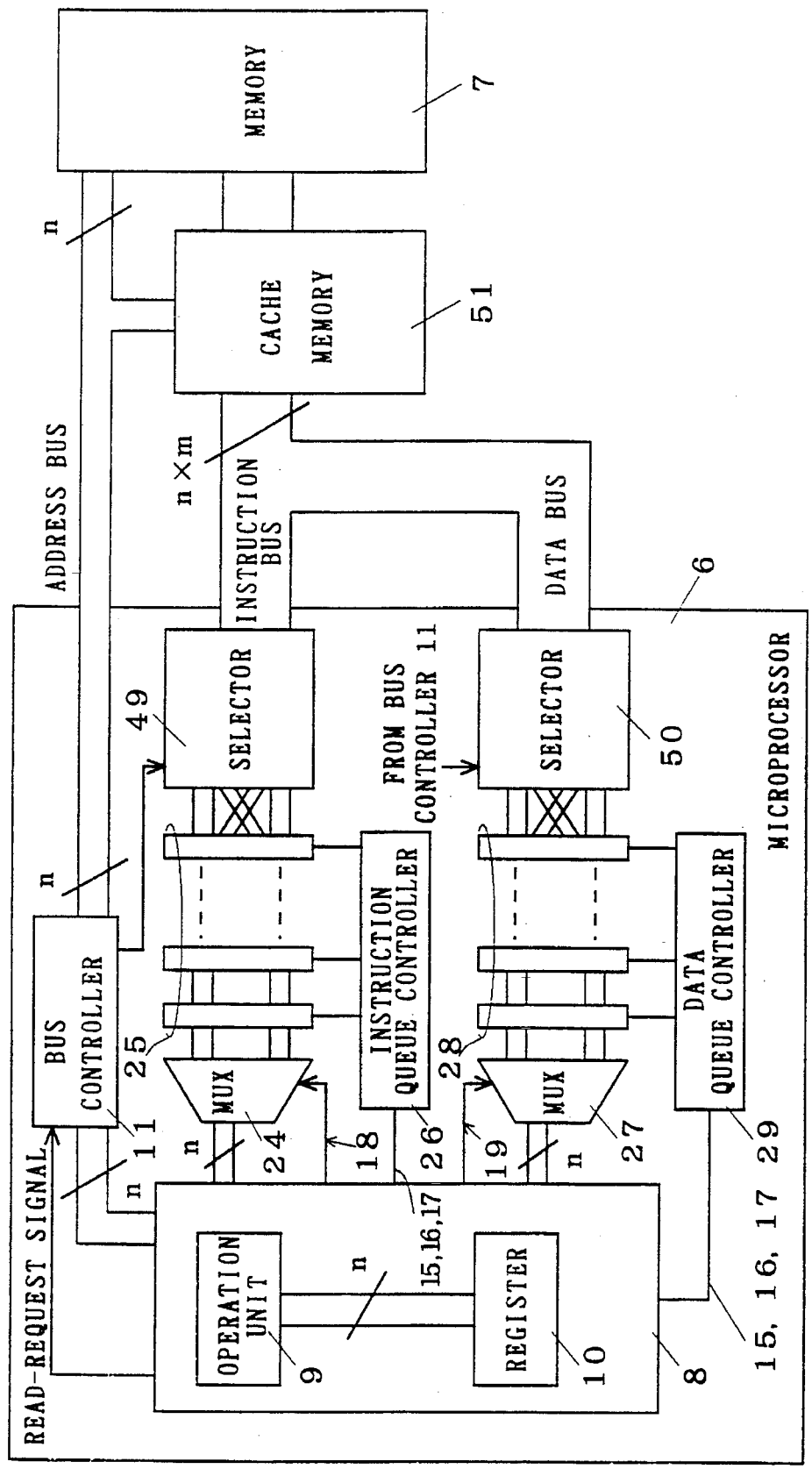
FIG. 23 is a circuit diagram showing a configuration where a cache memory 51 is interposed between the microprocessor 6 and the memory 7.

Furthermore, as shown in FIG. 23, a cache memory 51 may be additionally provided between the memory 7 and the microprocessor 6.

As discussed above, the thirteenth preferred embodiment, in which the selectors 49 and 50 are additionally provided when the group of queues is separated into those for the instruction and for data, makes an efficient use of queues. Furthermore, providing the cache memory 51 ensures a high-speed operation of the semiconductor integrated circuit.

The Fourteenth Preferred Embodiment

Figure 24:
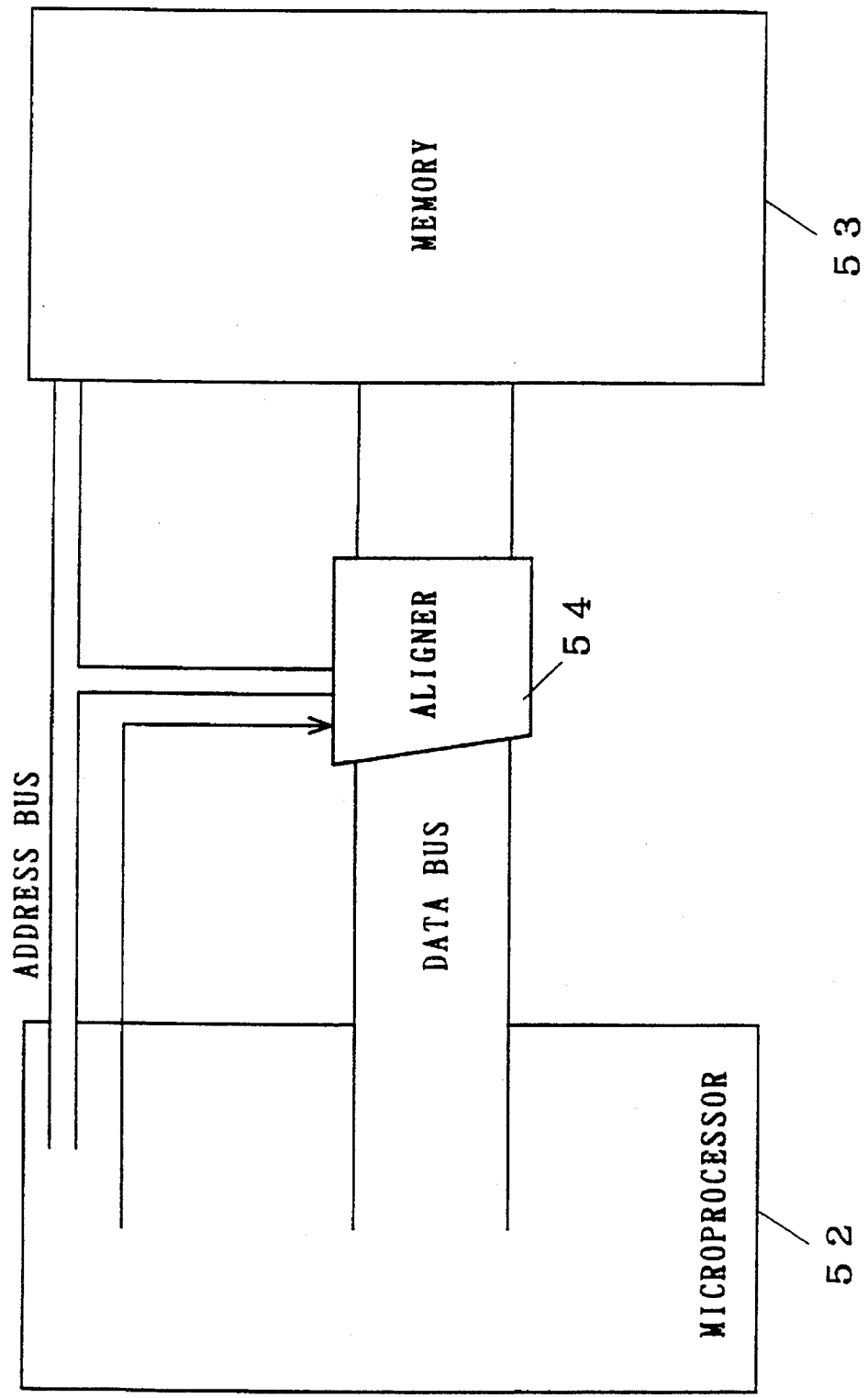
FIG. 24 is a circuit diagram showing a configuration of a semiconductor integrated circuit in accordance with a fourteenth preferred embodiment of the present invention.
Figure 25:
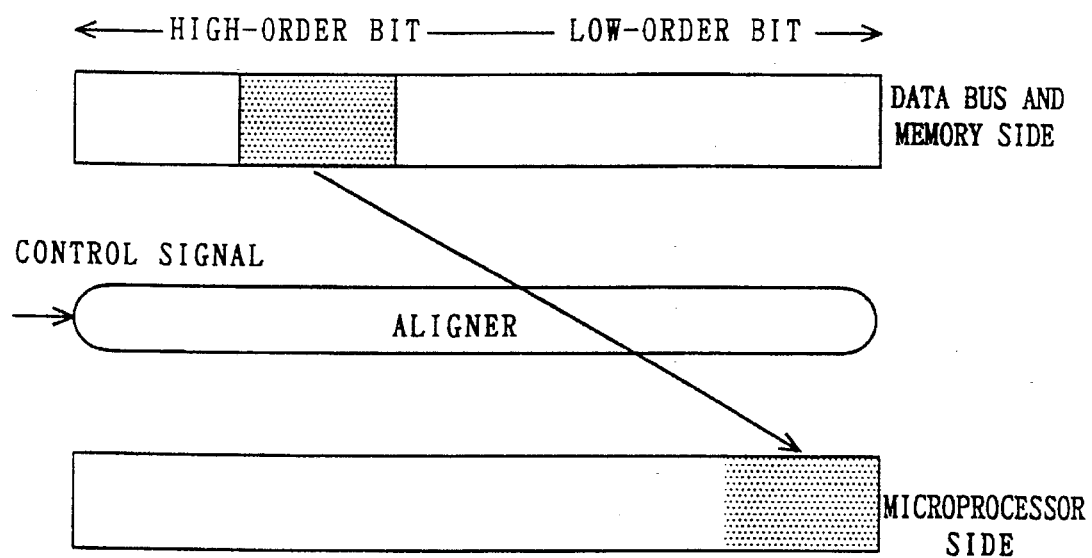
FIG. 25 is a view illustrating an operation of an aligner 54.

FIG. 24 shows a configuration of a semiconductor integrated circuit in accordance with a fourteenth preferred embodiment. A microprocessor 52 is connected to a memory 53 through a data bus and an address bus. An aligner 54 is disposed at some midpoint in the data bus and shifts part of the data to be inputted to the microprocessor 52 to an appropriate position in the data so as to put the data in proper order. FIG. 25 shows a function of the aligner 54. When there arises a need for shifting the position of effective data (indicated by shadowed portion) to be processed in the microprocessor 52 out of the (n×m)-bit data from the memory 7, the aligner 54 shifts the effective data in accordance with a control signal received from the microprocessor 52 and outputs the shifted data to the microprocessor 52. There is a need for the aligner 54 in order to process different-sized data in the same bit width. Within the microprocessor 52, the group of queues are provided like in other preferred embodiments discussed above. Thus, since an aligner which has been a cause of the degradation in performance of the microprocessor 52 is provided outside the microprocessor 52, the internal operation of the microprocessor 52 becomes much less burdensome.

The data bus (or instruction bus) has an (n×m)-bit width, i.e., m times n-bit width when the microprocessor 52 can process n-bit data (instructions) at a time. Furthermore, a plurality of groups of instruction queues or data queues may be provided in the microprocessor 52.

Figure 26:
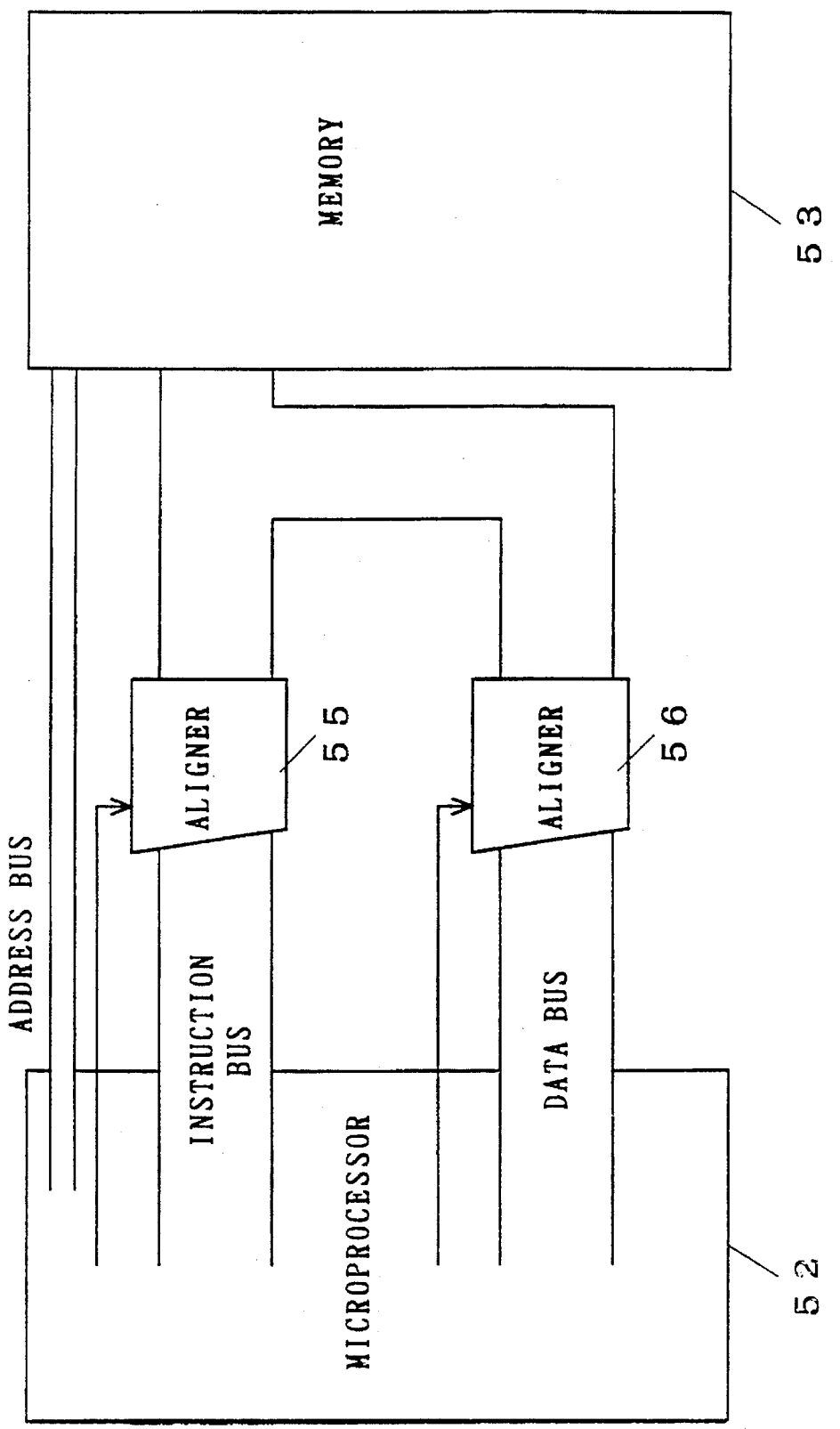
FIG. 26 is a circuit diagram showing a configuration where an instruction bus and a data bus are provided with aligners 55 and 56, respectively.
Figure 27:
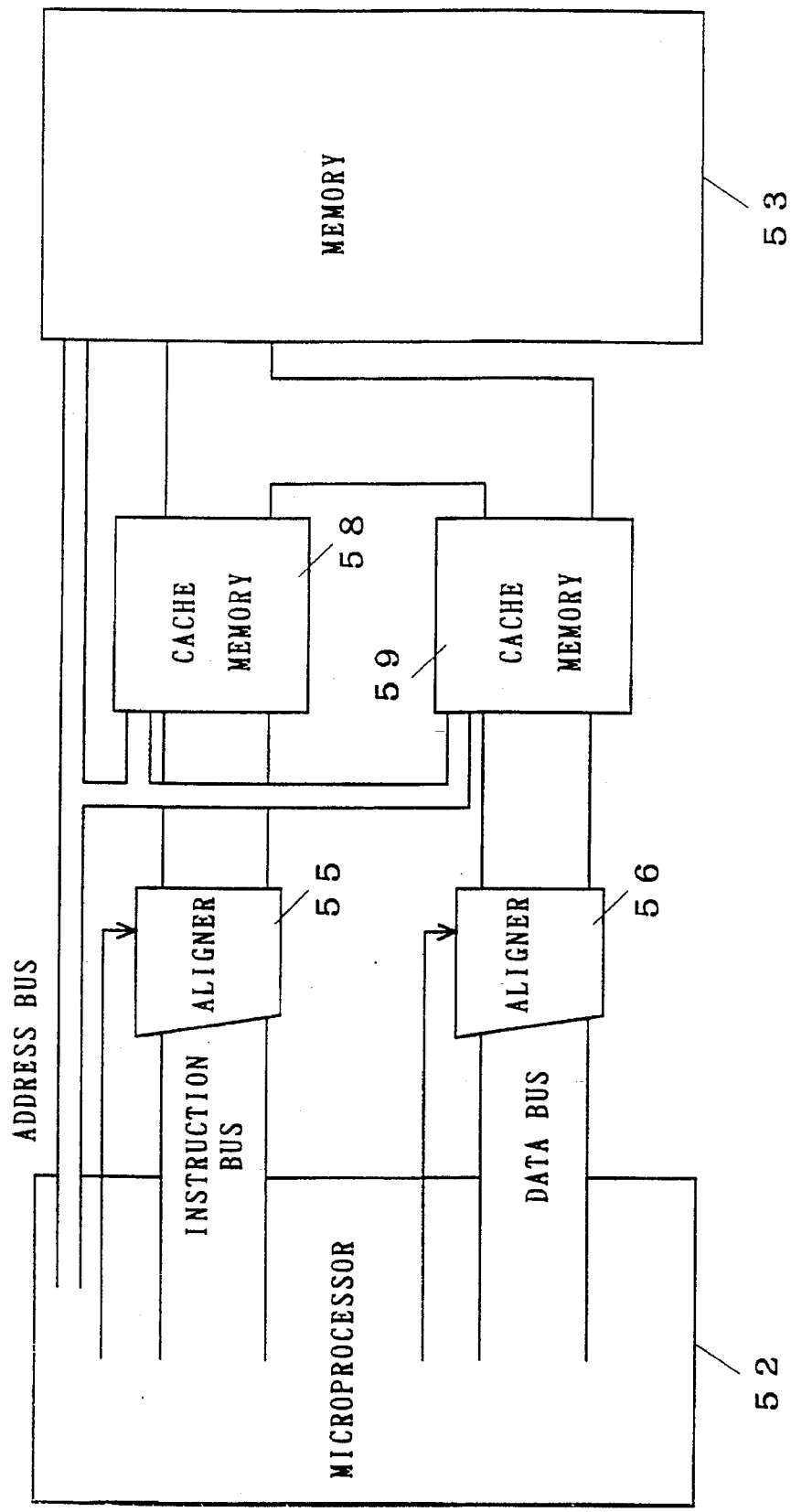
FIG. 27 is a circuit diagram showing a configuration where cache memories 58 and 59 are additionally provided in the configuration of FIG. 26.
Figure 28:
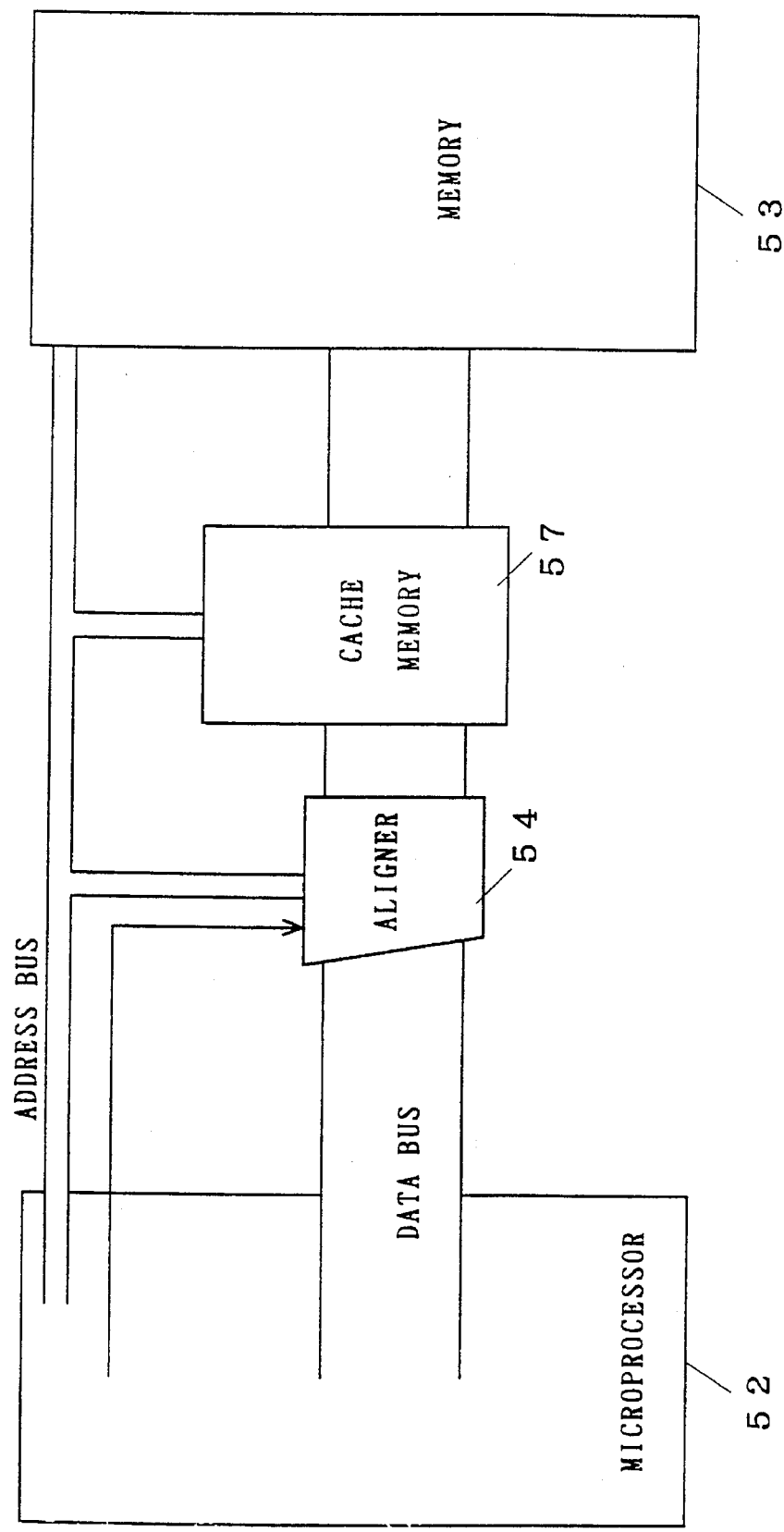
FIG. 28 is a circuit diagram showing a configuration where a cache memory 57 is interposed between the aligner 54 and a memory 53.
Figure 29:
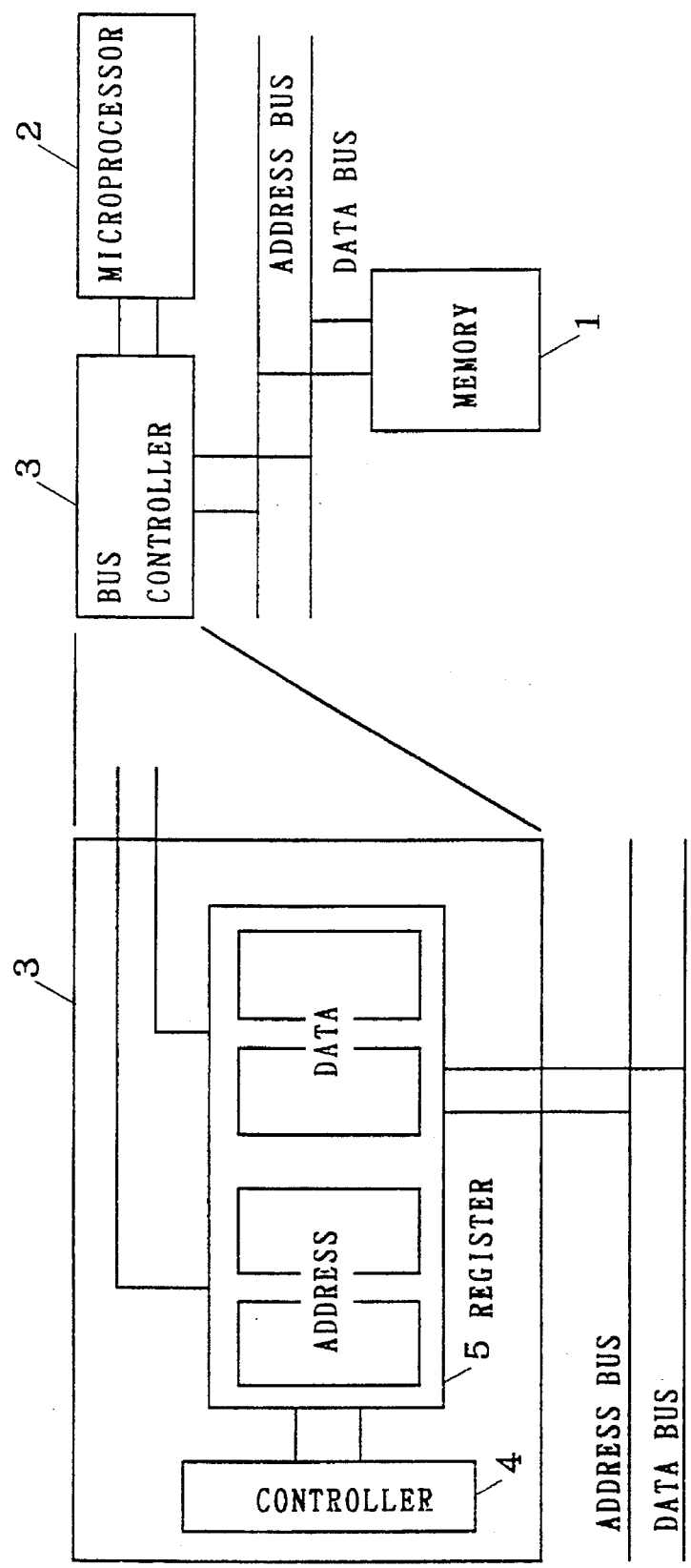
FIG. 29 is a circuit diagram showing a configuration of a prior art semiconductor integrated circuit.

There also may be a configuration, as shown in FIG. 26, where the bus is separated into an instruction bus and a data bus and aligners 55 and 56 are disposed at some midpoints in the instruction bus and the data bus, respectively. Furthermore, as shown in FIG. 27, providing cache memories 58 and 59 between the memory and the respective aligners 55 and 56 allows instruction access or data access to be made at higher speed, and therefore ensures a high-speed operation of the semiconductor integrated circuit. There may be another configuration, as shown in FIG. 28, where a common data bus is provided and the cache memory 57 is provided between the aligner 54 and the memory 53, thereby ensuring a high-speed operation of the semiconductor integrated circuit.

While the invention has been shown and described in detail, the foregoing description is in all aspects illustrative and not restrictive. It is therefore understood that numerous modifications and variations can be devised without departing the scope of the invention.

We claim:

1. A semiconductor integrated circuit, comprising:

a core for processing first data in units of n bits (n is an integer more than 1);

at least one queue of (n×m)-bit width (m>1), for receiving second data having a bit width of (n×m) bits or less from an external memory and storing said second data therein; and a multiplexer for receiving said second data from said at least one queue and selectively outputting n bits out of said second data to said core as said first data.

2. The semiconductor integrated circuit of claim 1, wherein said at least one queue includes p queues (p is an integer more than 1) serially connected to one another, said p queues constitute a group of queues, and said semiconductor integrated circuit further comprises a queue control portion for transmitting said second data to said multiplexer by sequentially shifting said second data from one of said p queues to the next one.

3. The semiconductor integrated circuit of claim 2, further comprising a bus of (n×m)-bit width, for transmitting said second data from said external memory to said group of queues.

4. The semiconductor integrated circuit of claim 3, wherein said second data are variable-length data, and said semiconductor integrated circuit further comprises a selector for outputting said second data to a prescribed memory location of the nearest one of said queues to said bus.

5. The semiconductor integrated circuit of claim 4, further comprising a cache memory interposed at some midpoint in said bus.

6. A semiconductor integrated circuit, comprising:

(a) a core for processing a first instruction or first data in units of n bits (n is an integer more than 1);

(b) a group of instruction queues including (b-1) a first instruction queue of (n×m)-bit width (m>1), for receiving second instruction having a bit width of (n×m) bits or less from an external memory and storing said second instruction therein; and (b-2) an s-th instruction queue (1<s≦p: p is an integer more than 1) of (n×m)-bit width, for receiving said second instruction from an (s−1)-th instruction queue and storing said second instruction therein;

said group of instruction queues having serial connection of said first to p-th instruction queues, (c) a group of data queues including (c-1) a first data queue of (n×m)-bit width (m>1), for receiving second data having a bit width of (n×m) bits or less from said external memory and storing said second data therein; and (c-2) a t-th data queue (1<t≦q: q is an integer more than 1) of (n×m)-bit width, for receiving said second data from a (t−1)-th data queue and storing said second data therein;

said group of data queues having serial connection of said first to q-th data queues, (d) a queue control portion for sequentially shifting said second instruction and said second data in said group of instruction queues and said group of data queues, respectively;

(e) a first multiplexer for receiving said second instruction from said p-th instruction queue and selectively outputting n bits out of said second instruction to said core as said first instruction; and (f) a second multiplexer for receiving said second data from said q-th data queue and selectively outputting n bits out of said second data to said core as said first data.

7. The semiconductor integrated circuit of claim 6, wherein said second instruction and said second data are variable-length data, and said semiconductor integrated circuit further comprises (g) a first selector disposed between said group of instruction queues and said external memory, for outputting said second instruction to a prescribed memory location of said first instruction queue; and (h) a second selector disposed between said group of data queues and said external memory, for outputting said second data to a prescribed memory location of said first data queue.

8. The semiconductor integrated circuit of claim 6, further comprising:

(g) an instruction bus connecting said external memory to said first instruction queue, for transmitting said second instruction; and (h) a data bus connecting said external memory to said first data queue, for transmitting said second data.

9. The semiconductor integrated circuit of claim 8, wherein said external memory is separated into an instruction memory and a data memory, and said instruction bus and said data bus are connected to said instruction memory and said data memory, respectively.

10. A semiconductor integrated circuit, comprising:

(a) a core for processing a first instruction or first data in units of n bits (n is an integer more than 1);

(b) a group of instruction queues including (b-1) a first instruction queue of n-bit width, for receiving n bits out of second instruction from an external memory and storing said n bits out of said second instruction therein; and (b-2) an s-th instruction queue (1<s≦p: p is an integer more than 1) of n-bit width, for receiving said n bits out of said second instruction from an (s−1)-th instruction queue and storing said n bits out of said second instruction therein;

said group of instruction queues having serial connection of said first to p-th instruction queues, (c) a group of data queues including (c-1) a first data queue of n-bit width, for receiving n bits out of second data from said external memory and storing said n bits out of said second data therein; and (c-2) a t-th data queue (1<t≦q: q is an integer more than 1) of n-bit width, for receiving said n bits out of said second data from a (t−1)-th data queue and storing said n bits out of said second data therein;

said group of data queues having serial connection of said first to q-th data queues, (d) a group of common queues of {n×(m−1)}-bit width, for receiving both said second instruction and said second data and storing them therein;

(e) a queue control portion for sequentially shifting said second instruction and said second data in said group of instruction queues and said group of data queues, respectively, and in said group of common queues;

(f) a first bus of n-bit width connecting said external memory to said first instruction queue and said first data queue, for transmitting said second instruction and said second data;

(g) a second bus of {n×(m−1)}-bit width connecting said external memory to said group of common queues, for transmitting said second instruction and said second data;

(h) a first multiplexer for receiving said second instruction from both said group of instruction queues and said group of common queues, and selectively outputting said n bits out of said second instruction to said core as said first instruction; and (i) a second multiplexer for receiving said second data from both said group of data queues and said group of common queues, and selectively outputting said n bits out of said second data to said core as said first data.

11. The semiconductor integrated circuit of claim 10, further comprising (j) a cache memory interposed at some midpoint in said second bus.

12. A semiconductor integrated circuit, comprising:

(a) a core for processing a first instruction or first data in units of n bits (n is an integer more than 1);

(b) a group of instruction queues including (b-1) a first instruction queue of (n×m)-bit width (m>1), for receiving second instruction having a bit width of (n×m) bits or less from an external memory and storing said second instruction therein; and (b-2) an s-th instruction queue (1<s≦p: p is an integer more than 1) of (n×m)-bit width, for receiving said second instruction from an (s−1)-th instruction queue and storing said second instruction therein;

said group of instruction queues having serial connection of said first to p-th instruction queues, (c) a group of data queues including (c-1) a first data queue of n-bit width, for receiving second data of n-bit width from said external memory and storing said second data therein; and (c-2) a t-th data queue (1<t≦q: q is an integer more than 1) of n-bit width, for receiving said second data from a (t−1)-th data queue and storing said second data therein;

said group of data queues having serial connection of said first to q-th data queues, (d) a queue control portion for sequentially shifting said second instruction and said second data in said group of instruction queues and said group of data queues, respectively; and (e) a multiplexer for receiving said second instruction from said p-th instruction queue and selectively outputting n bits out of said second instruction to said core as said first instruction, wherein said first data is obtained from said q-th data queue.

13. The semiconductor integrated circuit of claim 12, further comprising:

(f) an instruction bus connecting said external memory to said first instruction queue, for transmitting said second instruction; and (g) a data bus connecting said external memory to said first data queue, for transmitting said second data.

14. The semiconductor integrated circuit of claim 13, wherein said external memory is separated into an instruction memory and a data memory, and said instruction bus and said data bus are connected to said instruction memory and said data memory, respectively.

15. A semiconductor integrated circuit, comprising:

(a) a core for processing a first instruction or first data in units of n bits (n is an integer more than 1);

(b) a group of instruction queues including (b-1) a first instruction queue of n-bit width, for receiving second instruction of n-bit width from an external memory and storing said second instruction therein; and (b-2) an s-th instruction queue (1<s≦p: p is an integer more than 1) of n-bit width, for receiving said second instruction from an (s−1)-th instruction queue and storing said second instruction therein;

said group of instruction queues having serial connection of said first to p-th instruction queues, (c) a group of data queues including (c-1) a first data queue of (n×m)-bit width (m>1), for receiving second data having a bit width of (n×m) bits or less from said external memory and storing said second data therein; and (c-2) a t-th data queue (1<t≦q: q is an integer more than 1) of (n×m)-bit width, for receiving said second data from a (t−1)-th data queue and storing said second data therein;

said group of data queues having serial connection of said first to q-th data queues, (d) a queue control portion for sequentially shifting said second instruction and said second data in said group of instruction queues and said group of data queues, respectively; and (e) a multiplexer for receiving said second data from said q-th data queue and selectively outputting n bits out of said second data to said core as said first data, wherein said first instruction is obtained from said p-th instruction queue.

16. The semiconductor integrated circuit of claim 15, further comprising:

(f) an instruction bus connecting said external memory to said first instruction queue, for transmitting said second instruction; and (g) a data bus connecting said external memory to said first data queue, for transmitting said second data.

17. The semiconductor integrated circuit of claim 16, wherein said external memory is separated into an instruction memory and a data memory, and said instruction bus and said data bus are connected to said instruction memory and said data memory, respectively.

18. A semiconductor integrated circuit, comprising:

(a) a core for processing a first instruction or first data in units of n bits (n is an integer more than 1);

(b) a group of instruction queues including (b-1) a first instruction queue of (n×m)-bit width (m>1), for receiving second instruction having a bit width of (n×m) bits or less from an external memory and storing said second instruction therein; and (b-2) an s-th instruction queue (1<s≦p: p is an integer more than 1) of (n×m)-bit width, for receiving said second instruction from an (s−1)-th instruction queue and storing said second instruction therein;

said group of instruction queues having serial connection of said first to p-th instruction queues, (c) a group of data queues including (c-1) a first data queue of (n×k)-bit width (k>m), for receiving second data having a bit width of (n×k) bits or less from said external memory and storing said second data therein: and (c-2) a t-th data queue (1<t≦q: q is an integer more than 1) of (n×k)-bit width, for receiving said second data from a (t−1)-th data queue and storing said second data therein;

said group of data queues having serial connection of said first to q-th data queues, (d) a queue control portion for sequentially shifting said second instruction and said second data in said group of instruction queues and said group of data queues, respectively;

(e) a first multiplexer for receiving said second instruction from said p-th instruction queue and selectively outputting n bits out of said second instruction to said core as said first instruction; and (f) a second multiplexer for receiving said second data from said q-th data queue and selectively outputting n bits out of said second data to said core as said first data.

19. The semiconductor integrated circuit of claim 18, further comprising:

(g) an instruction bus connecting said external memory to said first instruction queue, for transmitting said second instruction; and (h) a data bus connecting said external memory to said first data queue, for transmitting said second data.

20. The semiconductor integrated circuit of claim 19, wherein said external memory is separated into an instruction memory and a data memory, and said instruction bus and said data bus are connected to said instruction memory and said data memory, respectively.

21. The semiconductor integrated circuit of claim 3, further comprising an aligner interposed at some midpoint in said bus.

22. The semiconductor integrated circuit of claim 8, further comprising an aligner interposed at some midpoint in at least one of said instruction bus and said data bus.

23. The semiconductor integrated circuit of claim 13, further comprising an aligner interposed at some midpoint in at least one of said instruction bus and said data bus.

24. The semiconductor integrated circuit of claim 16, further comprising an aligner interposed at some midpoint in at least one of said instruction bus and said data bus.

25. The semiconductor integrated circuit of claim 19, further comprising an aligner interposed at some midpoint in at least one of said instruction bus and said data bus.

* * * * *